(12) United States Patent
Wells et al.

(10) Patent No.: US 6,817,006 B1
(45) Date of Patent: Nov. 9, 2004

(54) APPLICATION-SPECIFIC TESTING METHODS FOR PROGRAMMABLE LOGIC DEVICES

(75) Inventors: Robert W. Wells, Cupertino, CA (US); Zhi-Min Ling, Cupertino, CA (US); Robert D. Patrie, Scotts Valley, CA (US); Vincent L. Tong, Fremont, CA (US); Jae Cho, Sunnyvale, CA (US); Shahin Toutounchi, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 131 days.

(21) Appl. No.: 10/104,324

(22) Filed: Mar. 22, 2002

Related U.S. Application Data

(63) Continuation-in-part of application No. 09/924,365, filed on Aug. 7, 2001, now Pat. No. 6,664,808.

(51) Int. Cl.[7] .............................................. G06F 17/50
(52) U.S. Cl. ............................ 716/16; 716/17; 716/18
(58) Field of Search ............................ 716/4–6, 16–18; 714/733, 725; 326/39, 41; 365/201

(56) References Cited

U.S. PATENT DOCUMENTS

| | | | |
|---|---|---|---|
| 3,995,261 A | | 11/1976 | Goldberg |
| 4,020,469 A | | 4/1977 | Manning |
| 4,700,187 A | | 10/1987 | Furtek |
| 5,404,359 A | * | 4/1995 | Gellenwater et al. ....... 714/733 |
| 5,459,342 A | | 10/1995 | Nogami et al. |
| 5,498,975 A | | 3/1996 | Cliff et al. |
| 5,539,652 A | * | 7/1996 | Tegethoff ..................... 703/14 |
| 5,889,413 A | | 3/1999 | Bauer |
| 5,903,578 A | * | 5/1999 | De et al. .................... 714/726 |
| 5,914,616 A | | 6/1999 | Young et al. |
| 5,982,683 A | * | 11/1999 | Watson et al. .............. 365/201 |
| 6,166,559 A | | 12/2000 | McClintock et al. |
| 6,167,558 A | | 12/2000 | Trimberger |
| 6,215,327 B1 | * | 4/2001 | Lyke ............................ 326/41 |
| 6,216,258 B1 | * | 4/2001 | Mohan et al. ................ 716/17 |
| 6,292,018 B1 | * | 9/2001 | Kean ........................... 326/41 |
| 6,331,788 B1 | * | 12/2001 | Lyke ............................ 326/39 |
| 6,353,915 B1 | * | 3/2002 | Deal et al. ..................... 716/4 |
| 6,356,514 B1 | | 3/2002 | Wells et al. |

OTHER PUBLICATIONS

"Generation of PD patterns and computer aided analysis for defects in GIS" by Gupta et al. High Voltage Engineering, 1999 Eleventh International Symposium on (Conf. Publ. No. 467), vol.: 5, Aug. 23–27, 1999 pp.: 284–287 vol. 5.*

Guler et al., "Built–in Self–test Generator Design using Nonuniform Cellular Automata Model", IEEE Proceedings Circuits Devic and System, vol. 145. No. 3, pp. 155–161, Jun. 1998.*

Champeau et al., "Flexible Parallel FPGA–Based Architecture with ArMen", 1994 IEEE Proceedings of Twenty–Seventh Annual Hawaii International Conference on System Sciences, pp 105–113, 1994.*

U.S. patent application Ser. No. 08/786,818, Chapman et al., filed Jan. 21, 1997.

* cited by examiner

*Primary Examiner*—Vuthe Siek
*Assistant Examiner*—Naum Levin
(74) *Attorney, Agent, or Firm*—Arthur Joseph Behiel; Edel M. Young

(57) ABSTRACT

Disclosed are methods for utilizing programmable logic devices that contain at least one localized defect. Such devices are tested to determine their suitability for implementing selected designs that may not require the resources impacted by the defect. If the FPGA is found to be unsuitable for one design, additional designs may be tested. The test methods in some embodiments employ test circuits derived from a user's design to verify PLD resources required for the design. The test circuits allow PLD vendors to verify the suitability of a PLD for a given user's design without requiring the PLD vendor to understand the user's design.

25 Claims, 17 Drawing Sheets

US 6,817,006 B1

APPLICATION-SPECIFIC TESTING METHODS FOR PROGRAMMABLE LOGIC DEVICES

CROSS-REFERENCE TO RELATED APPLICATIONS

This application is a continuation-in-part of U.S. patent application Ser. No. 09/924,365 entitled "A METHOD OF USING PARTIALLY DEFECTIVE PROGRAMMABLE LOGIC DEVICES," by Zhi-Min Ling et al., filed on Aug. 7, 2001, now U.S. Pat. No. 6,664,808 which is incorporated herein by reference.

FIELD OF THE INVENTION

The present invention relates to programmable logic devices, and more particularly to methods for testing and using programmable logic devices that contain minor defects.

BACKGROUND OF THE INVENTION

Programmable logic devices (PLDs), such as field-programmable gate arrays (FPGAs), are user-programmable integrated circuits that can be programmed to implement user-defined logic circuits. In a typical architecture, an FPGA includes an array of configurable logic blocks (CLBs) surrounded by programmable input/output blocks (IOBs). A hierarchy of programmable routing resources interconnects the CLBs and IOBs. Loading a configuration bitstream into configuration memory cells of the FPGA customizes these CLBs, IOBs, and programmable routing resources. Additional resources, such as multipliers, memory, and application-specific circuits may also be included.

PLDs are growing ever larger as vendors attempt to satisfy customer demand for PLDs capable of performing ever more complex tasks. Unfortunately, as chip size increases, so too does the probability of finding a defect on a given chip. The process yield therefore decreases with PLD complexity, making already expensive PLDs still more expensive.

PLDS are not design specific, but instead afford users (e.g., circuit designers) the ability to instantiate an almost unlimited number of circuit variations. Not knowing in advance the purpose to which a given PLD will be dedicated places a heavy burden on the quality and reliability of the PLD because PLD vendors must verify the functionality of any feature that might be used. To avoid disappointing customers, PLD manufacturers discard PLDs that include even relatively minor defects.

PLD defects can be categorized in two general areas: gross defects that render the entire PLD useless or unreliable, and localized defects that damage a relatively small percentage of the PLD. It has been found that, for some large chips, close to two thirds of the chips on a given wafer may be discarded because of localized defects. Considering the costs associated with manufacturing large integrated circuits, discarding a large percentage of PLD chips has very significant adverse economic impact on PLD manufacturers.

SUMMARY

The present invention enables PLD manufactures to identify PLDs that, despite some defects, can flawlessly implement selected customer designs.

Subsequent to fabrication, the various chips on a given semiconductor wafer are tested for "gross" defects, such as power-supply shorts, that have a high probability of rendering a PLD unfit for any customer purpose. In a test methodology applicable to SRAM-based FGPAs, chips that survive gross testing are subjected to a "readback test" to verify the function of the configuration memory cells. Defect-free chips are subjected to further testing to ensure flawless performance, while chips that exhibit a large number or dense concentration of readback defects are rejected. Chips with relatively few defects are set-aside. as "ASIC candidates" and are subjected to further testing. Unlike the general tests normally performed to verify PLD functionality, in one embodiment the ASIC candidates are subjected to application-specific tests that verify the suitability of each candidate to function with one or more specific customer designs.

Some test methods in accordance with embodiments of the invention employ test circuitry derived from a user design to verify PLD resources required for the design. These methods verify the suitability of an FPGA for a given design without requiring an understanding of the design, and therefore greatly reduce the expense and complexity of developing design-specific tests for a user design. Also advantageous, narrowing test scope to those resources required for a given design reduces the time required for testing and increases the number of saleable PLDs. Using test circuits other than the user design to test the resources required for the user design facilitates comprehensive testing without requiring an understanding of the user design.

The foregoing test methods will not forestall PLD vendors from selling fully tested, defect-free PLDs. Customers will still require defect-free PLDs to develop customer-specific designs and to bring these designs to market quickly. However, once a customer has a specific design, the aforementioned test procedures can provide reduced-cost PLDs that are physically and functionally identical to the fully functional PLD or PLDs first used to develop the customer-specific design.

In accordance with one embodiment of the invention, a customer interested in the potential cost savings associated with recovered PLDs will send an expression of the customer-specific design (e.g., a data file) to the PLD vendor. The vendor will then use the expression to test ASIC candidates in the manner described above. ASIC candidates that are physically and functionally identical to the defect-free PLD first used to instantiate the customer-specific design can then be sold to the customer at reduced cost.

This summary does not limit the scope of the invention, as the scope of the invention is defined by the claims.

DETAILED DESCRIPTION

The present invention relates to programmable logic devices. In the following description, numerous specific details are set forth to provide a more thorough understanding of embodiments of the present invention. However, it will be apparent to one skilled in the art that the present invention may be practiced without these specific details. In other instances, well-known features have not been described in detail in order to avoid obscuring the present invention.

Figure 1:
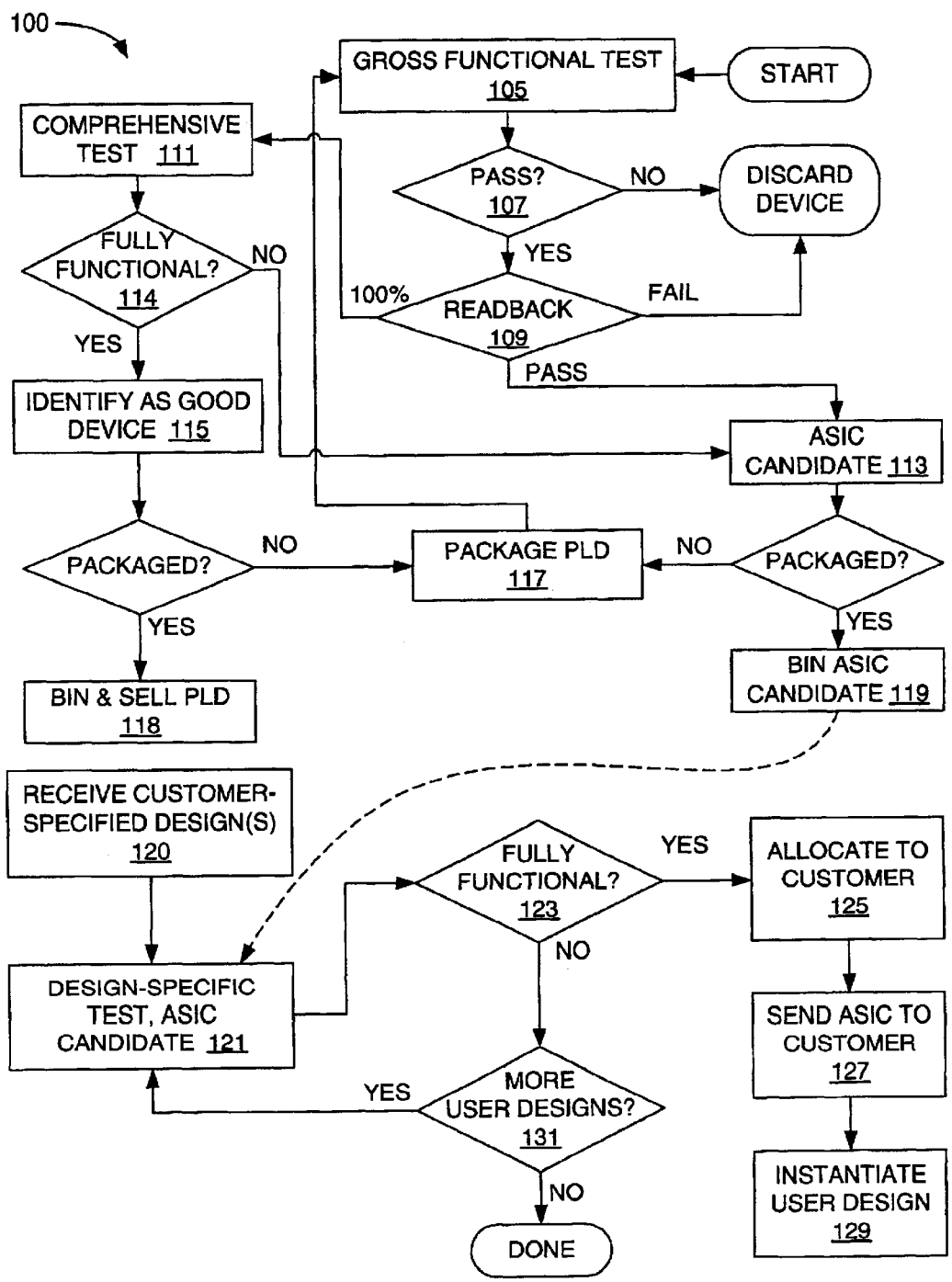
FIG. 1 is a flow chart 100 showing one embodiment of the present invention as applied to FPGAs. Subsequent to fabrication, the various chips on a given semiconductor wafer are tested for "gross" defects (step 105).

FIG. 1 is a flow chart 100 showing one embodiment of the present invention as applied to FPGAs. Subsequent to fabrication, the various chips on a given semiconductor wafer are tested for "gross" defects (step 105). For purposes of the present disclosure, "gross" defects are defects that have a high probability of rendering a PLD unfit for any customer purpose. Examples of gross defects include power-supply shorts, opens, excessive leakage, defective clock-management circuitry, and significant numbers of defective programmable memory cells. Chips with gross defects are discarded (decision 107). Various tests for gross defects are described in chapter 14 of "Application-Specific Integrated Circuits," by Michael John Sebastian Smith (1997), which is incorporated herein by reference.

Chips that survive decision 107 are subjected to a "readback test" to verify the function of the configuration memory cells (decision 109). In this step, configuration memory is programmed to include various patterns of configuration data and then read back to verify the correct program states of those cells. In one embodiment, chips are rejected if they have a large number or concentration of defects. The number considered "large" will depend upon the size of the PLD in question and the distribution of the defects, as these parameters determine the likelihood of such defects rendering a PLD useless for instantiating customer designs (also referred to as "user designs").

At decision 109, defective chips with greater than the maximum allowable number of defects are discarded, chips with no defects are sent on to step 111 for comprehensive testing, and defective chips with a number of defects less than the maximum allowed number are identified as "ASIC candidates" (step 113). ASIC candidates are those chips that, though imperfect, may have adequate resources to instantiate some user designs. Other embodiments might separate ASIC candidates based on their likelihood of success at implementing a user design. For example, a device with only one defect might be considered more valuable than a device with five defects.

Those PLDs having no identified defects through decision 109 are thoroughly tested to ensure conformance to strict performance criteria. Circuit vendors must verify both speed performance and functionality of each device. Fully functional chips are identified as good devices (step 115). These chips are then packaged (step 117) and the resulting PLDs are subjected to the same series of tests as were the unpackaged chips, beginning once again at step 105. The tests are run again to ensure no defects were introduced by or during the packaging process. If a packaged chip is defect free, the process will eventually return to step 115 and the packaged PLD will be binned accordingly and sold to a customer (step 118). Although not shown, the conventional test process for PLDs additionally includes speed binning.

Chips that are less than fully functional, but that nevertheless survived decisions 107 and 109, are identified as "ASIC candidates" (step 113). Unpackaged ASIC candidates are packaged (step 117) and the resulting packaged PLDs are subjected to the same series of tests as were the unpackaged chips, beginning again at step 105. Each packaged chip may be discarded by decisions 107 or 109, or may be identified once again as an ASIC candidate (step 113). This time, however, the packaged device is binned as a packaged ASIC candidate (step 119) to be tested to determine whether, despite imperfections, it will reliably implement a user design.

At some time prior to the next step in the illustrated test method, the PLD manufacturer asks for and receives one or more user designs expressed using the appropriate PLD design software (step 120). These designs are adapted for use in the type of PLD under test (e.g., a PLD of the same size and pin configuration). A first of these customer designs is then analyzed to create design-specific test circuits to be instantiated on one of the ASIC candidates of step 119. These test circuits are used to determine whether the ASIC candidate functions with the customer design. Such functionality is not unlikely, as customer designs typically leave a substantial portion of their programmable resources unused, and the defects in the PLD may be limited to these unused portions. Test 121, a design-specific test, is detailed below.

In decision 123, if the ASIC candidate under test is fully functional with the design of interest, the device is identified as acceptable for use with the particular design (step 125). The device is eventually sent to the customer (step 127), who then programs the ASIC candidate with the user design used in step 121 (step 129). Alternatively, if step 123 shows the design of interest is not fully functional in the selected device, one or more additional user designs may be tried (decision 131). The process is finished when for a given ASIC candidate the device is allocated for use with a customer design or the user designs are exhausted. If no suitable design is found, the ASIC candidate may be discarded or saved for testing on later received user designs. An ASIC candidate might be discarded after, for example, ten failed attempts to instantiate different user designs.

ASIC candidates allocated to a selected customer design are labeled accordingly to ensure they are not used in applications that may require defective resources. ASIC candidates may also be adapted to reject any but the verified user design. For example, a unique signature, such as a cyclic-redundancy-check (CRC) value of the bitstream for the verified design, may be stored in non-volatile memory on the PLD and used to verify the design.

In conventional testing, many PLDs are rejected for having a small number of random defects. Identifying ones of these that may nevertheless function perfectly with specific user designs allows PLD manufacturers and their customers to benefit from the use of PLDs that would otherwise be wasted. PLD manufactures benefit from significantly improved yield, and PLD customers benefit because PLDs suitable for their particular purpose are available at a lower price. Also advantageous from the user perspective, the recovered PLDs are physically and functionally identical to the fully functional PLDs first used to bring their products to market, so there are no engineering resources otherwise required to adapt their product to a new ASIC. The time normally required to adapt a product to a new ASIC is also reduced, allowing customers to move more quickly to a less expensive alternative to fully functional PLDS.

Flowchart 100 is illustrative; in practice, the flow may be quite different, with different steps accomplished in different orders and/or at different times. For example, step 121 may be performed using different test equipment than that used to verify "defect-free" PLDS. Moreover, flowchart 100 illustrates the case in which each wafer may provide PLDs and ASIC candidates. In other embodiments, wafers may be dedicated entirely to PLDs or entirely to ASIC candidates. PLD yield and the customer demand for ASIC candidates will be considered in determining the proportion of wafers or chips allocated to ASIC candidates.

Figure 2:
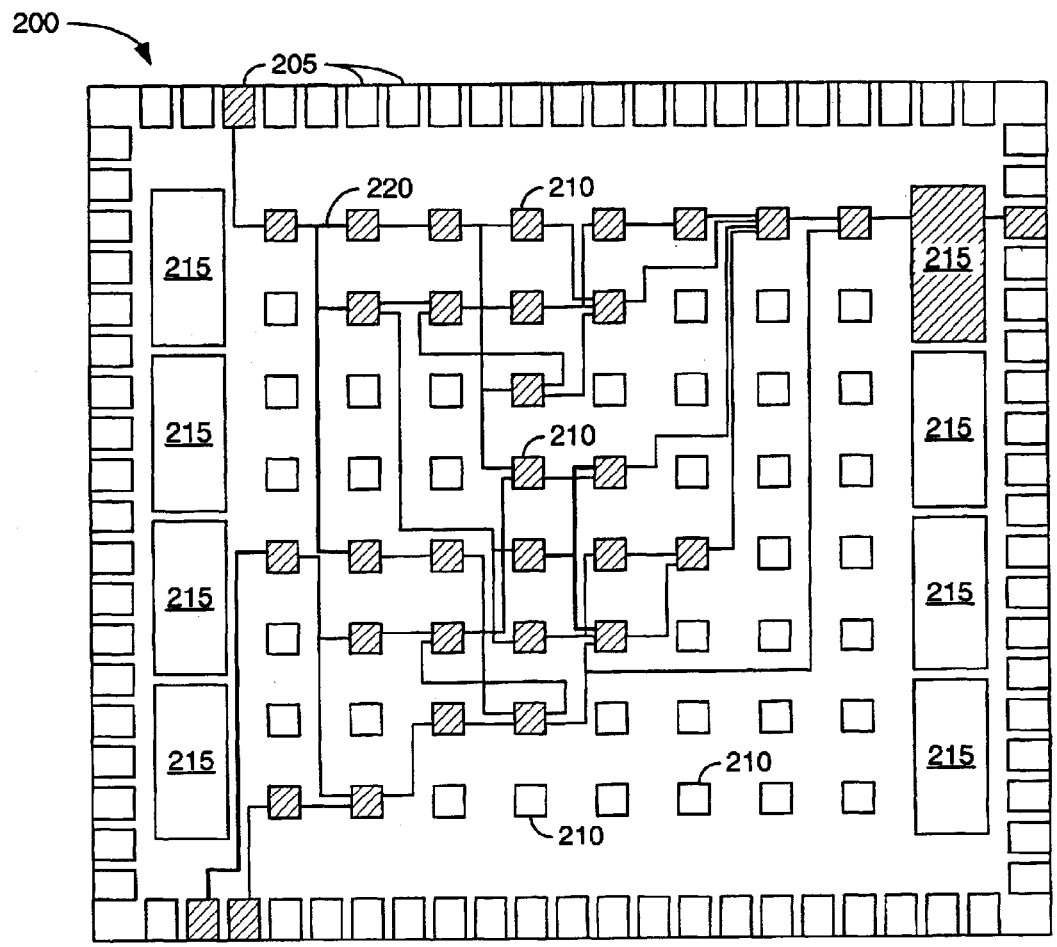
FIG. 2 is a block diagram of a conventional FPGA 200 in which is instantiated an illustrative user design.

FIG. 2 is a block diagram of a conventional FPGA 200 in which is instantiated an illustrative user design. FPGA 200 includes a collection of programmable logic, including a plurality of input/output blocks (IOBs) 205, an array of configurable logic blocks (CLBs) 210, and a plurality of RAM blocks 215, all of which may be selectively interconnected via programmable routing resources. CLBs 210 are the primary building blocks and contain elements for implementing customizable gates, flip-flops, and wiring; IOBs 205 provide circuitry for communicating signals with external devices; and RAM blocks 215 allow for synchronous or asynchronous data storage, though each CLB can also implement synchronous or asynchronous RAMS. For a detailed treatment of one FPGA, see the Xilinx advance product specification entitled "Virtex-II 1.5V Field-Programmable Gate Arrays," DS031-2 (v1.9), Nov. 29, 2001, which is incorporated herein by reference.

Figure 3:
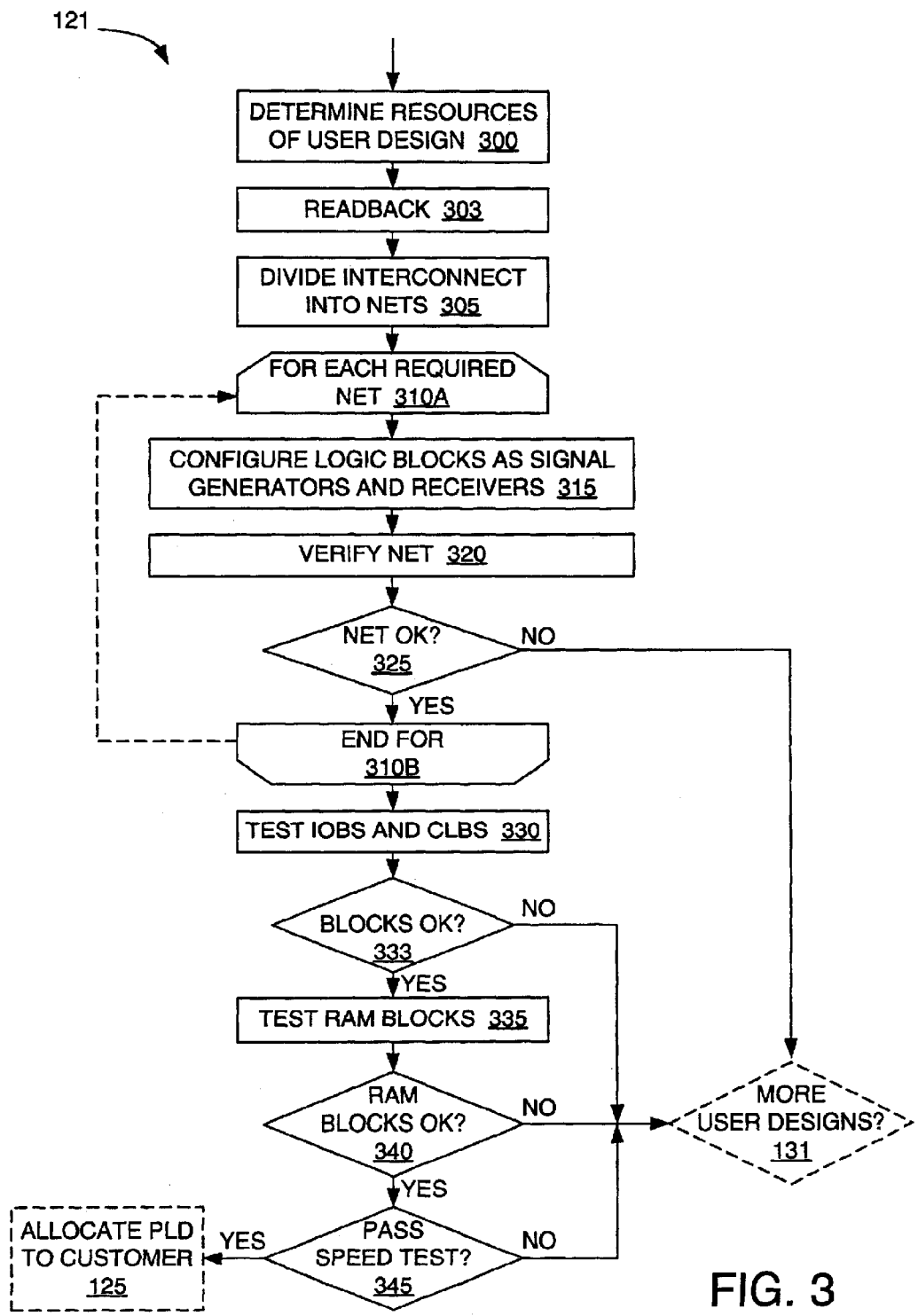
FIG. 3 is a flowchart detailing the design-specific test step 121 of FIG. 1.

FIG. 3 is a flowchart detailing the design-specific test step 121 of FIG. 1. This test advantageously facilitates comprehensive testing without the expense and complexity of developing design-specific tests for a user design.

To begin with, software analyzes the user design to identify the resources required for the design (step 300). Such resources are depicted in the fictional example of FIG. 2 as the shaded IOBs 205, CLBs 22, RAM block 215, and the interconnect resources 220 used to interconnect them (the remaining interconnect resources are omitted here for clarity). Also included but not shown are the programmable memory cells required to define the user configuration. Step 303 is a readback test to verify the functionality of the configuration bits required for the user design. Software that carries out steps of test methods in accordance with embodiment of the present invention can be stored on any computer-readable medium. Examples of computer-readable media include magnetic and optical storage media and semiconductor memory.

Next, the software divides the interconnect specified in the user design into a set of nets (step 305), wherein each net is a portion of the interconnect defined between source and destination nodes. A number of sample nets are depicted in FIG. 2 using bold lines. In general, each net includes a single signal source and one or more signal destinations. The collection of nets together includes all signal paths defined by the user design, and the nets used for testing are selected to minimize overlap (that is, minimize the number of wires used to relay signals but not actually used in the design). A FOR loop defined between steps 310A and 310B (FIG. 3) defines a test for verifying the integrity of each net.

Dividing the interconnect into a collection of nets is only one way to test the interconnect resources associated with a given design. For other methods of testing interconnect resources, see e.g. pending U.S. patent application Ser. No. 09/837,380 filed Apr. 17, 2001 entitled "Providing Fault Coverage of Interconnect in an FPGA," by Robert W. Wells, et al., which is incorporated herein by reference.

Beginning at step 315, the source element of a given net is configured as a signal generator, and the destination element or elements are configured as signal observers. The signal generator then provides signals to the destination circuits over the net to confirm the functionality of the net.

Figure 4:
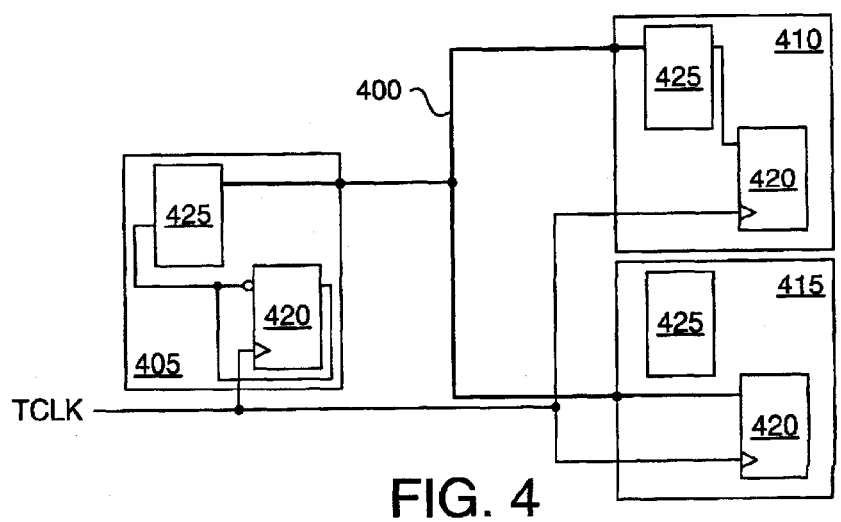
FIG. 4 depicts an exemplary net under test 400 and associated signal source 405 and destination circuits 410 and 415.

FIG. 4 depicts an exemplary net under test 400 and associated signal source 405 and destination circuits 410 and 415. Source 405 and circuits 410 and 415 are CLBs in the example, but each element might also be e.g. an IOB or a RAM block. In the example, source 405 is configured as a test-signal generator that produces a sequence of ones and zeros in response to a test clock TCLK. Source 405 includes a flip-flop 420 connected through a look-up table (LUT) 425 to net 400. Source 405 need not include LUT 425, but this example assumes the portion of net 400 within the CLB used to instantiate source 405 is a portion of the user design. If the interconnect in the user design instead extended directly from flip-flop 420, then the preferred simulated net would similarly extend directly from flip-flop 420.

Destination circuits 410 and 415 are configured as test-signal observers. Each includes a respective LUT 425 and flip-flop 420. Flip-flops 420 are adapted to store signals presented to destinations 410 and 415 over net 400. To test net 400 (step 320 of FIG. 3), signals from source 405 are clocked across net 400 into destination circuits 410 and 415 using a common test clock TCLK. The resulting contents of the flip-flops 420 in destination circuits 410 and 415 are then read back to ensure net 400 passed the correct data. The portions of net 400 that extend within destinations 410 and 415 are preferably the same portions employed by the user design. In the example, the user design includes local routing within destination 410 that conveys a signal to the respective LUT 425 and local routing within destination 415 that conveys a signal to the respective flip-flop 420.

If a net fails to convey the appropriate data at speed, the ASIC candidate fails for the design of interest (FIG. 3, decision 345). The process then moves on to the next design, if any (step 131 of FIG. 1). The foregoing process continues for each net of the user design until the PLD fails or the entire collection of nets is validated.

The programming process used to generate the configuration data defining the various test circuits, including the test-signal generators and observers, typically utilizes design entry software (e.g., synthesis or schematic tools), place-and-route software, and bitstream generation software executed on a personal computer or workstation. The software includes a library of pre-defined circuit "macros" that define the test-signal generator and observer logic functions for each type of programmable block for a given PLD type. The use of "macros" in PLD programming processes is well known.

Programmable blocks (e.g., IOBs, CLBs, and RAM) typically include memory elements and local routing (FIG. 21, discussed below, depicts one type of conventional CLB). In verifying the routing path between programmable blocks in a given customer design, it is preferred that the local routing within the blocks be the same local routing used in the customer design. Consequently, the cores used to instantiate test-signal generators and receivers include, where possible, internal routing identical to their counterparts in the customer design.

In one embodiment, a library of software macros includes, for each type of logic block, a set of signal generators and observers that includes every possible configuration of local interconnect resources. Providing a test circuit for a net in a customer design then includes selecting test-signal generator and observer library elements whose local interconnect configurations best match the corresponding logic-block configurations in the customer design.

Some logic-block functionality may be difficult to test using the types of signal generators and observers described above. It may be difficult, for example, to create a toggle flip-flop that.includes the carry chain resources available in some CLBs. In such cases, the logic blocks that cannot be modeled as a signal generator and/or signal observer are instead instantiated between two other logic blocks, one of which is configured as a test-signal generator, the other of which is configured as a test-signal observer. In this instance, the logic blocks that cannot be modeled as a signal generator or observer become a portion of the net connecting two other logic blocks.

Some embodiments of the invention perform further testing of the nets to locate shorts between interconnect resources that might impact a customer design. In one embodiment, for example, each net is tested with neighboring interconnect resources held high (e.g., to a logic one). The test can be repeated with neighboring resources held to a logic zero. A short between the net under test and a neighboring interconnect line will corrupt the data transmitted over the net.

Assuming all nets pass, the test procedure of FIG. 3 moves on to test the various IOBs 205 and CLBs 210 employed in the user design (e.g., the shaded IOBs 205 and CLBs 210 of FIG. 2). Many methods for testing programmable blocks are known to those skilled in testing programmable logic devices, and all of these may be used. Another method for testing IOBs, CLBs, and other resources involves programming the PLD to include special test circuits that exercise programmable logic. In one embodiment, the resources to be tested are configured to create a counter circuit connected to the address terminals of a linear-feedback shift register (LFSR). The interconnect employed to instantiate the shift registers for test are preferably the same interconnect verified during the foregoing test sequence.

LFSRs are cyclic, in the sense that when clocked repeatedly they go through a fixed sequence of states. Consequently, an LFSR that starts with a known set of data will contain a predictable set of data after a given number of clock periods. The fixed states of an LFSR are pseudo-random, with repetition rates that can be of virtually any length. The pseudo-random nature of LFSRs ensures that the internal memory and routing resources used to instantiate them are treated to a large number of permutations, provided that each LFSR is allowed to shift for a significant number of clock periods.

In accordance with one embodiment, an LFSR is preset to a known count (e.g., zero) and clocked a known number of times. The resulting count is then compared with a reference. If the resulting count matches the reference, then all of the resources used to implement the test circuit, including the memory and routing resources used to implement the LFSR, are deemed fully functional at the selected clock speed. If, however, the LFSR count does not match the reference, then the test fails. The test can be run at a number of different speeds to determine the maximum clock speed for the device under test.

Figure 5:
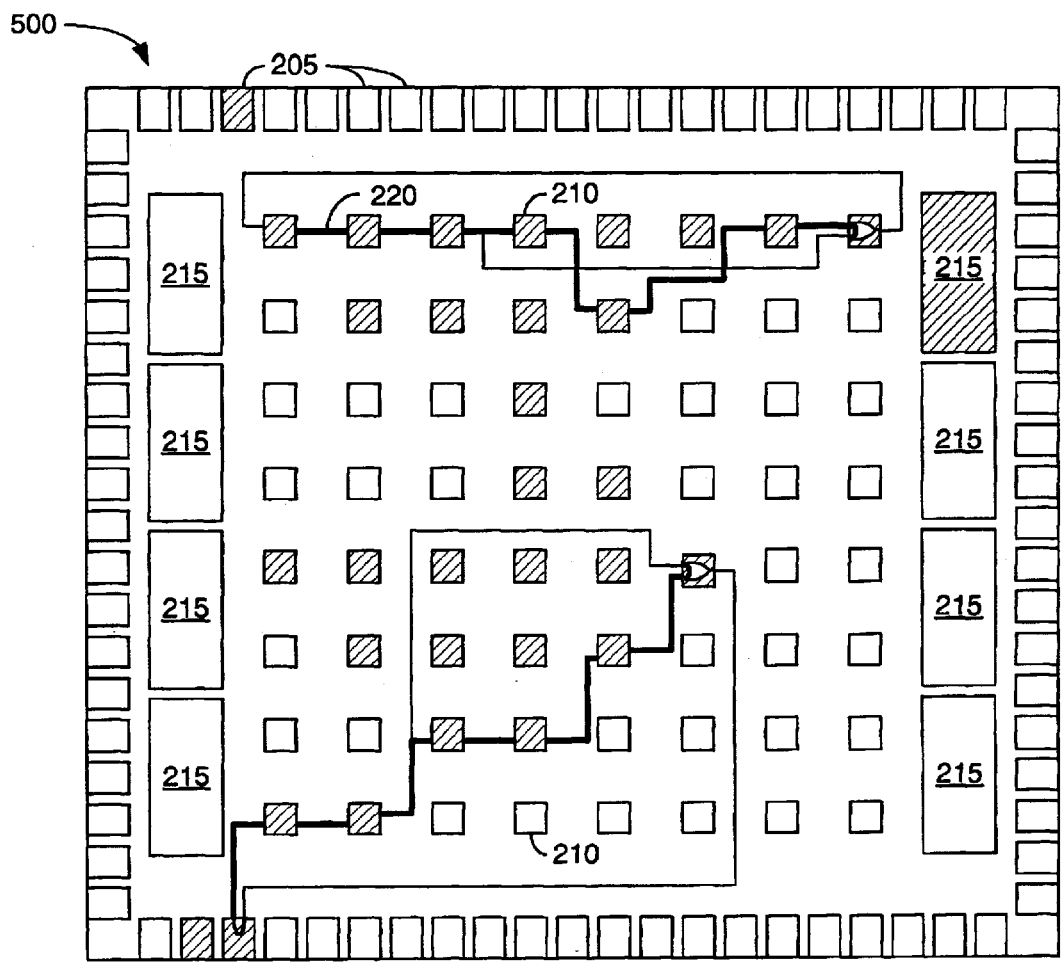
FIG. 5 depicts an FPGA 500 in which the CLBs, IOBs, and RAM block of the user design of FIG. 2 are shaded.

FIG. 5 depicts an FPGA 500 in which the CLBs, IOBs, and RAM block of the user design of FIG. 2 are shaded. Some of these resources are interconnected to form a pair of LFSRs using, in large part, routing resources (nets or portions of nets) verified as good in preceding test steps. The LFSRs can then be run to test their constituent logic resources. If the test fails (decision 333 of FIG. 3), then the test rejects the ASIC candidate for use with the present user design and attempts another user design, if any. If the test passes, then the test procedure moves to step 335, in which any RAM blocks are tested. RAM blocks can be tested using many test procedures. Specific examples employing LFSRs to test FPGA resources are described below in detail.

Should the RAM block test of step 335 fail, then the test rejects the PLD for use with the present user design and attempts another user design, if any. If the RAM block passes, the PLD may be subjected to a parametric test that verifies appropriate speed performance for signals traversing and critical paths in the user circuit of interest. (One method for verifying speed performance is discussed below.) If the PLD fails the speed test (decision 345), then the test rejects the PLD for use with the present user design and attempts another user design, if any. Otherwise, the ASIC candidate is deemed fit for use with the user's design, and is consequently allocated for sale to the appropriate customer (step 125).

FIGS. 6A through 6D (prior art) depict portions of circuit designs that can be instantiated on an FPGA to verify RAM-block functionality. Many other suitable embedded-memory tests are well known to those of skill in the art.

Figure 6A:
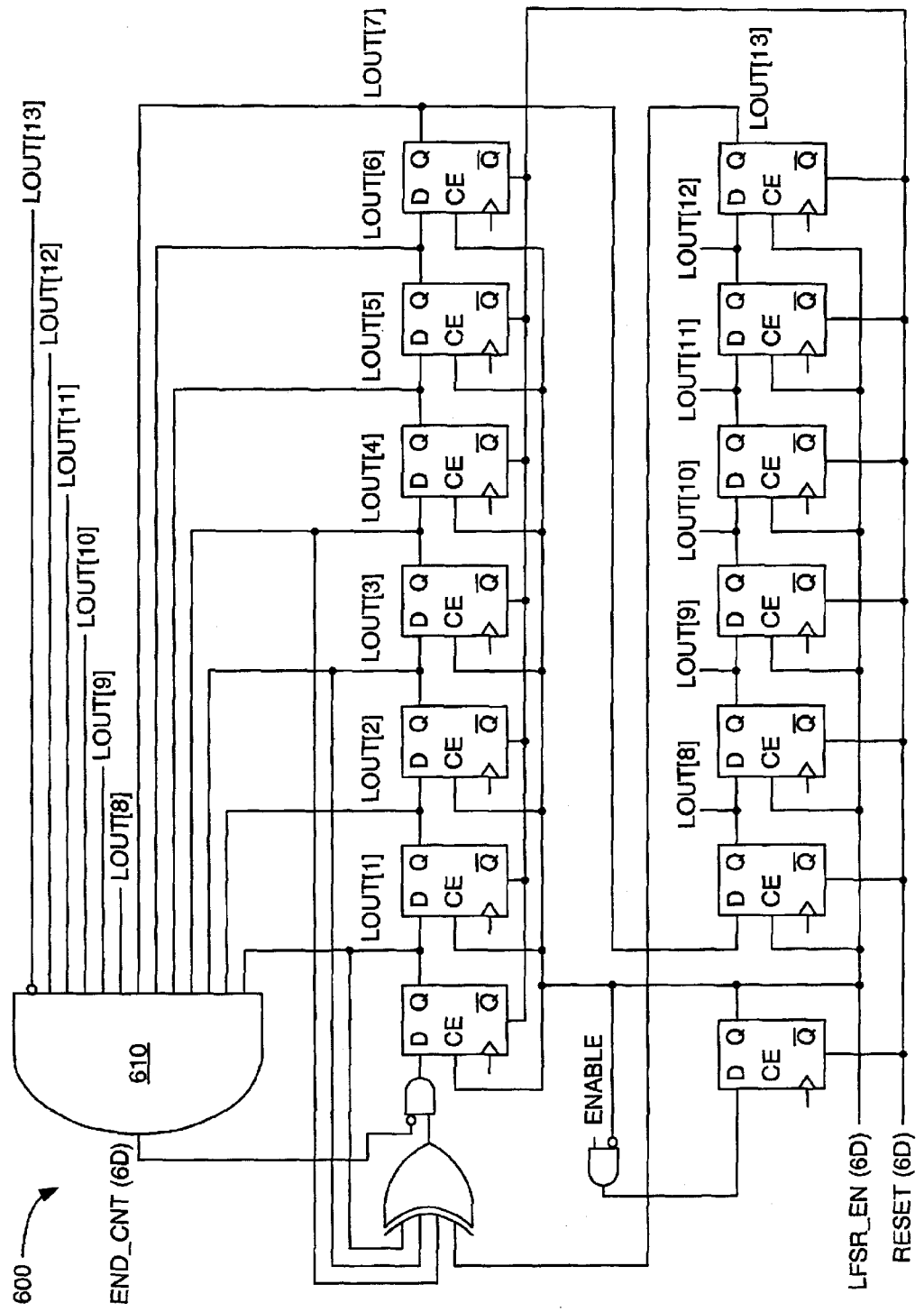
FIGS. 6A through 6D depict portions of circuit designs that can be instantiated on an FPGA to verify RAM-block functionality.

FIG. 6A schematically depicts an LFSR circuit 600 adapted to generate a pseudo-random sequence of addresses and data for testing a dual-port RAM block (i.e., a RAM block with ports A and B). For an N-bit LFSR counter, the maximum number of states the counter cycles through before repeating is $2^N-1$. The missing state is the all zero state. Because LFSR 600 is to test all RAM addresses, including address zero, LFSR 600 is an N+1 bit LFSR, where N is the width of the RAM address port.

If a typical N+1 LFSR counter were used to test a dual-port RAM in this manner, there would be an address collision between ports A and B when all the bits are one (i.e., both ports are addressing the same memory cell). An AND gate 610 and associated circuitry eliminates the "all ones" state to avoid such a collision. LFSRs are discussed in more detail below in connection with FIGS. 8–22.

One property of the LFSR counter 600 is that the data in storage element K+1 (i.e., $Q_{[K+1]}$) equals the data in storage element K (i.e., $Q_{[K]}$) after each clock. Using this property and assigning the RAM address of port A as $Q_{[N:1]}$ and RAM address of port B as $Q_{[N+1:2]}$, the address of port A will be the address of port B on the next clock cycle. we can exploit this property with, the following scheme:

TABLE 1

| Port A Address | Port B Address | Port A R/W | Port B R/W | Port A Data | Port B Data |
| --- | --- | --- | --- | --- | --- |
| Addr-1 | Addr-0 | Read | Read | Data-1 | ~Data-0 |
| Addr-1 | Addr-0 | Write | Write | ~Data-1 | Data-0 |
| Addr-2 | Addr-1 | Read | Read | Data-2 | ~Data-1 |
| Addr-2 | Addr-1 | Write | Write | ~Data-2 | Data-1 |

With this scheme of exercising the Block RAM, the contents of each RAM cell is read from and written to from both ports and the data is returned to its initial state. This allows the entire test to be repeated and looped as long as the test circuit remains functional. If any of the contents of the RAM is corrupted, the test circuit is reconfigured.

Figure 6B:
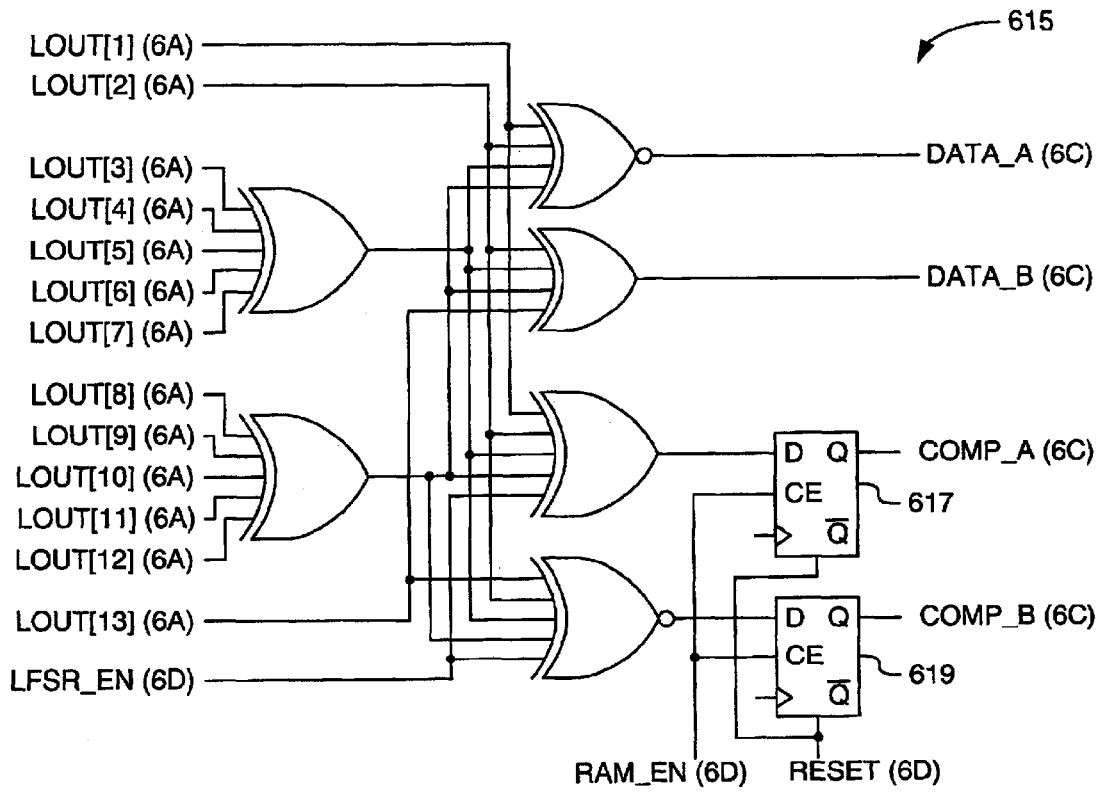

FIG. 6B depicts a data generator 615 for generating RAM test data from the thirteen outputs LOUT [1:13] from LFSR 600 of FIG. 6A. incidentally, signal designations terminating in an alphanumeric designation between parentheses identify the figure to or from which the signal line extends. In FIG. 6B, for example, signal line LOUT[1] (6A) comes from FIG. 6A.

The data DATA_A for address port A is based on the XNOR of LFSR output bits LOUT[1:12], whereas the data DATA_B for address port B is based upon the OR of LFSR output bits LOUT[2:13]. This method allows the expected data to be deterministic: DATA_A and DATA_B are known for any given address.

Data generator 615 includes a pair of flip-flops 617 and 619 for storing the complements COMP_A and COMP_B of DATA_A and DATA_B, respectively. Complements COMP_A and COMP_B are used to detect read and write errors.

Figure 6D:
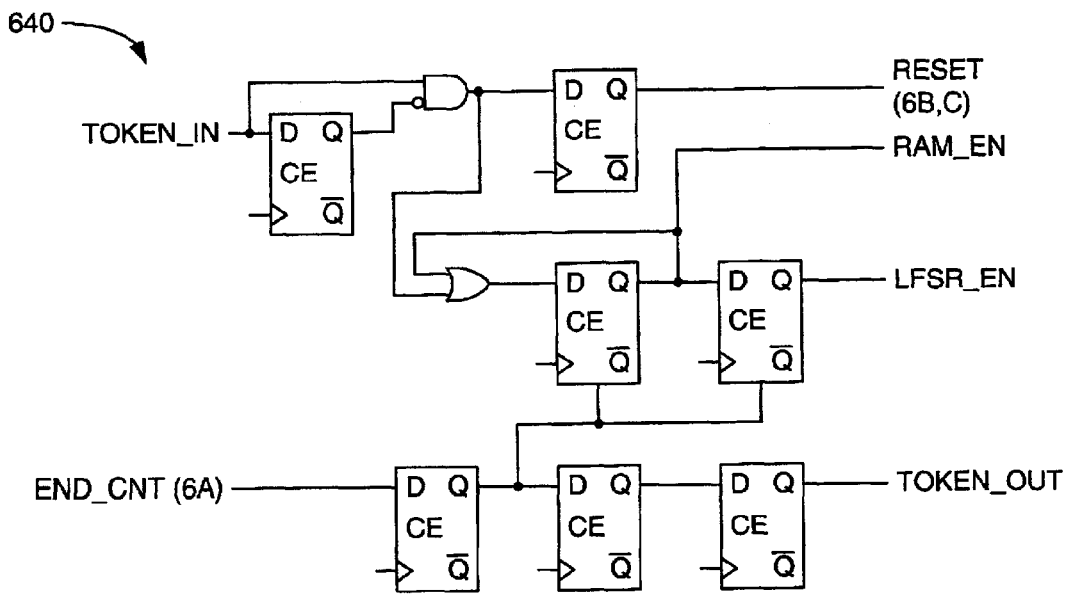
Figure 6C:
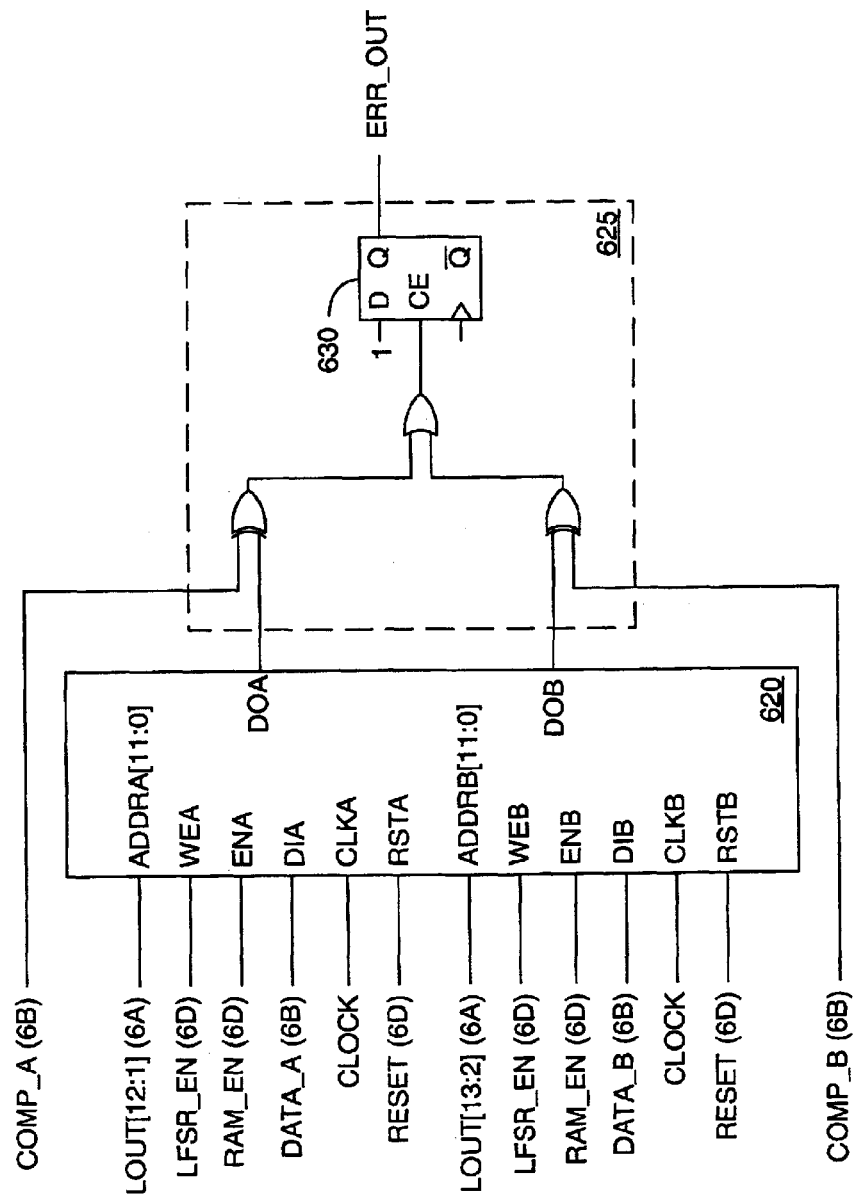

FIG. 6C depicts a RAM block 620 connected to an error detector 625. On every clock cycle, error detector 625 compares outputs DOA and DOB from Block RAM 620 with respective complementary signals COMP_A and COMP_B from FIG. 6B. This comparison occurs even if block RAM 620 is not enabled, and thus verifies whether block RAM 620 is enabled. During a read cycle, the data presented to block RAM 620 and the expected output signal are opposite, which ensures that a write cycle did not occur during a read cycle. A latch 630 captures any error condition and provides the resulting error signal on an output line ERR_OUT. The FPGA under test is rejected if RAM block 620, or any other RAM block associated with the user design of interest, produces an error signal.

FIG. 6D depicts token circuitry 640 that can be used to sequentially enable RAM blocks like block 620 for test. With large devices, particularly those with substantial amounts of block RAM (e.g., the Virtex™ V3200E or the V812EM available from Xilinx, Inc.), care should be taken to limit the amount of circuitry active during test, and thus reduce the amount of noise and dynamic current within the device. To this end, token circuitry 640 enables only one RAM block at a time. A low-to-high transition on an input terminal Token_In activates token circuitry 640. When the Token_In signal is detected, token circuitry 640 enables block LFSR 600, data generator 615, and RAM 620. Token circuitry 640 also generates a RESET pulse that resets the flip-flops of FIGS. 6A and 6B and RAM 620 of FIG. 6C. The flip-flops of FIGS. 6A–6D for which no reset line is shown are all reset before the test begins.

When LFSR 600 completes its count, an end-count signal END_CNT from AND gate 610 disables LFSR 600 and causes token circuit 640 to generate a "Token_Out" signal on a line TOKEN_OUT. Line TOKEN_OUT connects to the TOKEN_IN line of the next block RAM under test, if any. The token is thus passed from one RAM block to the next until all the RAM blocks in the user design are tested.

Figure 7:
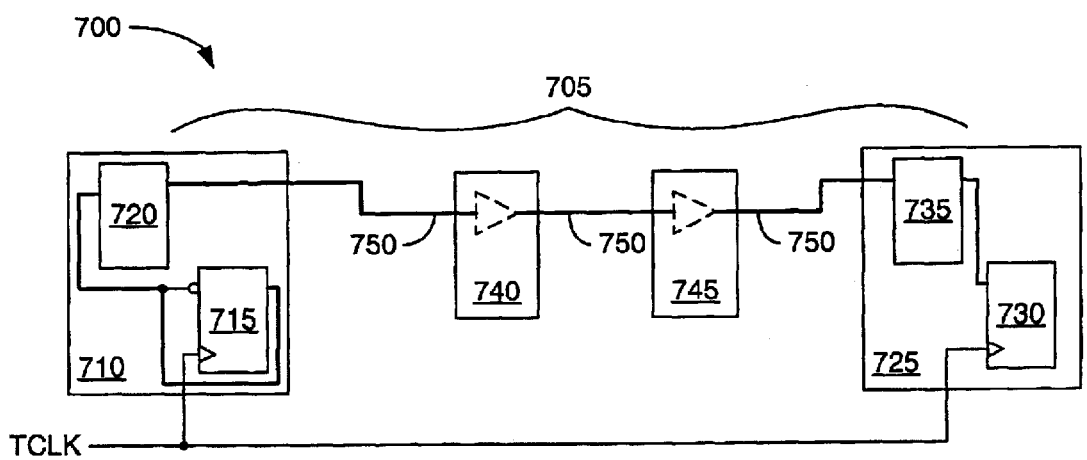
FIG. 7 schematically depicts a test circuit 700 adapted to verify the speed performance of a critical path 705 of a hypothetical user design.

FIG. 7 schematically depicts a test circuit 700 adapted to verify the speed performance of a critical path 705 of a hypothetical user design. Test circuit 705 includes a CLB 710 configured as a toggle flip-flop to generate a test signal for transmission through critical path 705. CLB 710 conventionally includes a flip-flop 715 and a LUT 720. Test circuit 700 additionally includes a CLB 725 adapted to receive and store data signals from CLB 710. CLB 725 includes a flip-flop 730 and a LUT 735.

In this illustrative example, critical path 705 is the path between flip-flop 715 and flip-flop 730, as indicated using relatively bold lines. The example assumes the critical path in the user design under test includes LUTs 720 and 735, a pair of CLBs 740 and 745, and three interconnect subnets 750. These elements are included in test circuit 705 because critical path 705 is preferably as similar as practical to the critical path in the user design. CLBs 740 and 745 are not necessarily programmed as in the user design, but can instead be programmed to merely pass the test signal (e.g., as buffers).

Critical path 705, and other critical paths, are identified by a conventional static timing analyzer and extracted from the user design of interest. For example, a user design intended to operate at 50 KHz will have a maximum register-to-register delay of about 20 us. The timing analyzer can be used to identify register-to-register paths with delays closest to 20us and then test these critical paths to ensure they pass both rising and falling edges in under 20 us. In practice, each critical path should be somewhat faster than required, so an appropriate guard band is subtracted from the minimum propagation delay.

Having identified the critical paths, test circuit 700 is created in the same manner described above in connection with FIG. 4. Whereas the test of FIG. 4 determined whether each net was functional, the test associated with test circuit 700 determines whether critical path 705 operates at speed. The speed test may be performed in a number of ways. In one embodiment, for example, flip-flops 715 and 730 are preset to known states and then clocked at the required frequency for a number of periods using a test clock TCLK on a like-named signal line. The state of flip-flop 730 is then read back to verify that the data from flip-flop 715 was received and stored properly. The test can be performed different ways, using different numbers of clocks, toggling the flip-flops on different edges, beginning with different stored data, etc., to ensure proper operation in a variety of circumstances.

For a discussion of alternative methods of performance testing PLDs, see U.S. Pat. Nos. 6,075,418 and 6,232,845, both to Kingsley, et al., and the above-incorporated Smith reference. Both Kingsley et al. patents are incorporated herein by reference. Using the test procedures outlined in the Kingsley et al. patents, collections of configurable resources are configured in a loop so that they together form a free-running ring oscillator. The oscillator produces an oscillating test signal in which the period is proportional to the speed of the components in the loop. Many such oscillators can be instantiated on a given PLD to measure speed performance.

In some embodiments, ASIC candidates can be tested using the methods and circuits described in Kingsley et al. The resources used in the customer design can be tested for speed. Alternatively, more exhaustive speed testing can be done before or after design-specific testing. In one embodiment, oscillators of the type described by Kingsley et al. are distributed across the PLD to test for speed. Some oscillators may not function at all due to the defects present in ASIC candidates. These oscillators are, in some embodiments, simply disregarded: the other tests outline above ensure the defects do not impact customer designs.

In addition to the test described above, ASIC candidates can be subjected to the same types of physical and reliability testing as the equivalent standard PLDs. Holding defective parts to high standards for specific customer designs may be important for encouraging customers to use the type of ASIC candidates identified using the above methods.

Once an ASIC candidate is verified for a particular customer design, the PLD manufacturer may want to prevent customers from using the PLD for other designs. One embodiment prevents such use by authenticating the customer design each time the PLD is configured by performing a hash function on the configuration bitstream. The result of the hash function is then compared to a proprietary hash key provided in non-volatile memory by the PLD manufacturer. The PLD will not function if the bitstream does not produce the required hash result.

FIGS. 8–22 and the associated text describe methods and test circuits that can be employed to test every programmable block on an FPGA. These methods and circuits are useful for performing the comprehensive testing of step 111 (FIG. 1); however, such comprehensive testing is not preferred for the design-specific testing of step 121 (FIGS. 1 and 3). The methods and test circuits are therefore limited to include those resources of the user design identified in step 300 (FIG. 3) and as little overhead as possible. Limiting the test-circuit overhead minimizes the possibility of rejecting a defective chip for design-specific use due to defects that have no impact on the specific design.

Figure 8:
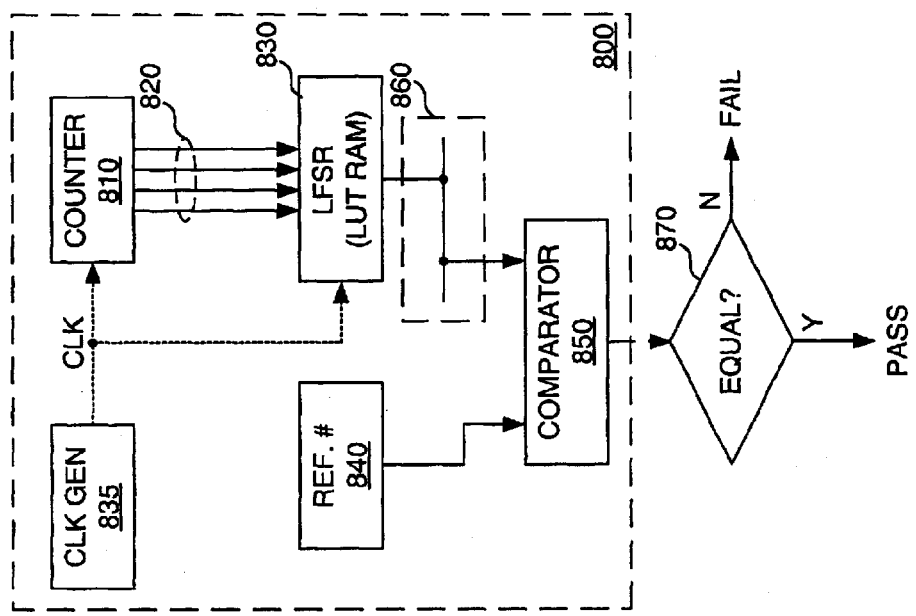
FIG. 8 depicts a test circuit 800 that can be used in accordance with the invention to perform at-speed functional tests of FPGA resources, including internal memory and routing resources.

FIG. 8 depicts a test circuit 800 that can be used in accordance with the invention to perform at-speed functional tests of FPGA resources, including internal memory and routing resources. In accordance with an embodiment of the invention, test circuit 800 is instantiated using resources employed by a user design and a minimal amount of additional resources. Test circuit 800 includes a counter 810 having output terminals 820 connected to the address terminals of a RAM array 830 configured as a linear-feedback shift register (LFSR). Test circuit 800 additionally includes a clock generator 835 configured to provide a clock signal on line CLK and a reference register 840 having an output terminal connected to an input terminal of a comparator 850. LFSR 830 connects to another input terminal of comparator 850 via routing resources 860.

The pseudo-random nature of LFSR 830 ensures that the memory locations within LFSR 830 will be treated to a large number of permutations if LFSR 830 is allowed to shift for a significant number of clock periods. Referring to decision block 870, if, after some number of clock transitions, the count provided to comparator 850 matches the correct reference number in register 840, then all of the resources used to implement test circuit 800 are deemed fully functional at the selected clock speed. If, however, the LFSR count does not match the count in register 840, then the test fails. The test can be run at a number of different speeds to determine the maximum clock speed for a device under test.

Figure 9:
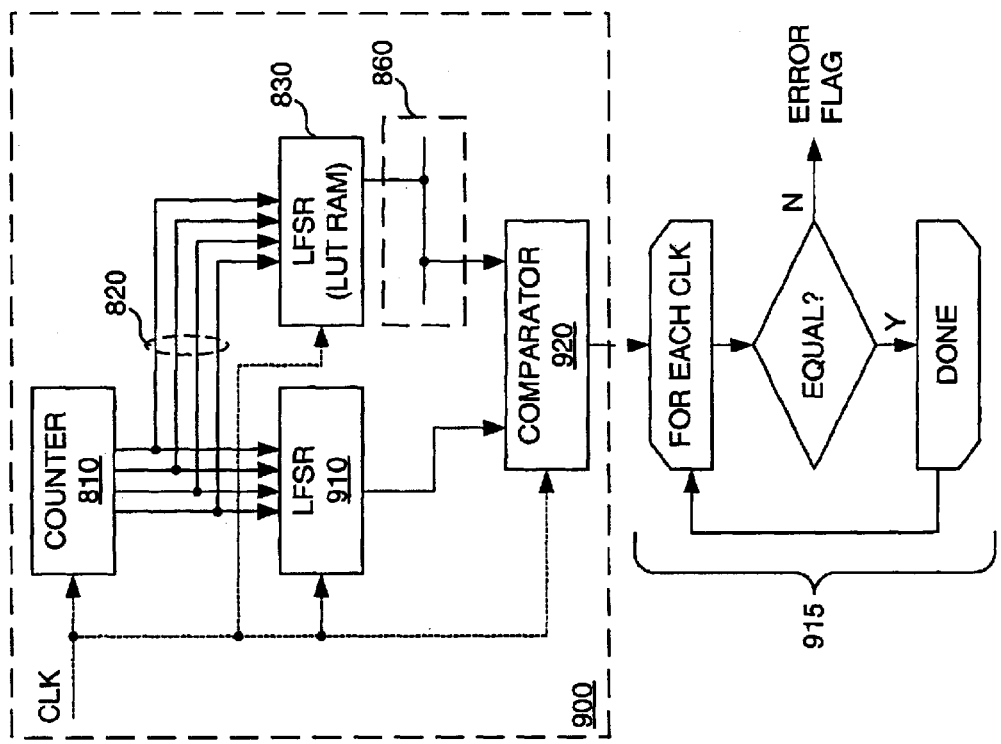
FIG. 9 depicts a test circuit 900 in accordance with another embodiment of the invention.

FIG. 9 depicts a test circuit 900 in accordance with another embodiment of the invention. Test circuit 900 is in some ways similar to test circuit 800 of FIG. 8, like-numbered elements being the same. Test circuit 900 additionally includes a second LFSR 910 also connected to output terminals 820 of counter 810. LFSR 910 is configured to produce the same output pattern as LFSR 830, so that the final results and each intermediate value from LFSR 830 and LFSR 910 should match after each clock cycle. As indicated in flowchart 915, test circuit 900 indicates an error if the output of a synchronous comparator 920 indicates a mismatch after any clock cycle.

LFSR 830 is implemented using on-chip memory to test the functionality of that memory. The remaining components, including the various interconnections between LFSR 910, counter 810, clock generator 835, and comparator 850, can also be implemented using FPGA resources. Thus configured, a passing test sequence on either of test circuits 800 or 900 indicates correct function, at speed, for all of the FPGA resources used in the test.

Figure 10:
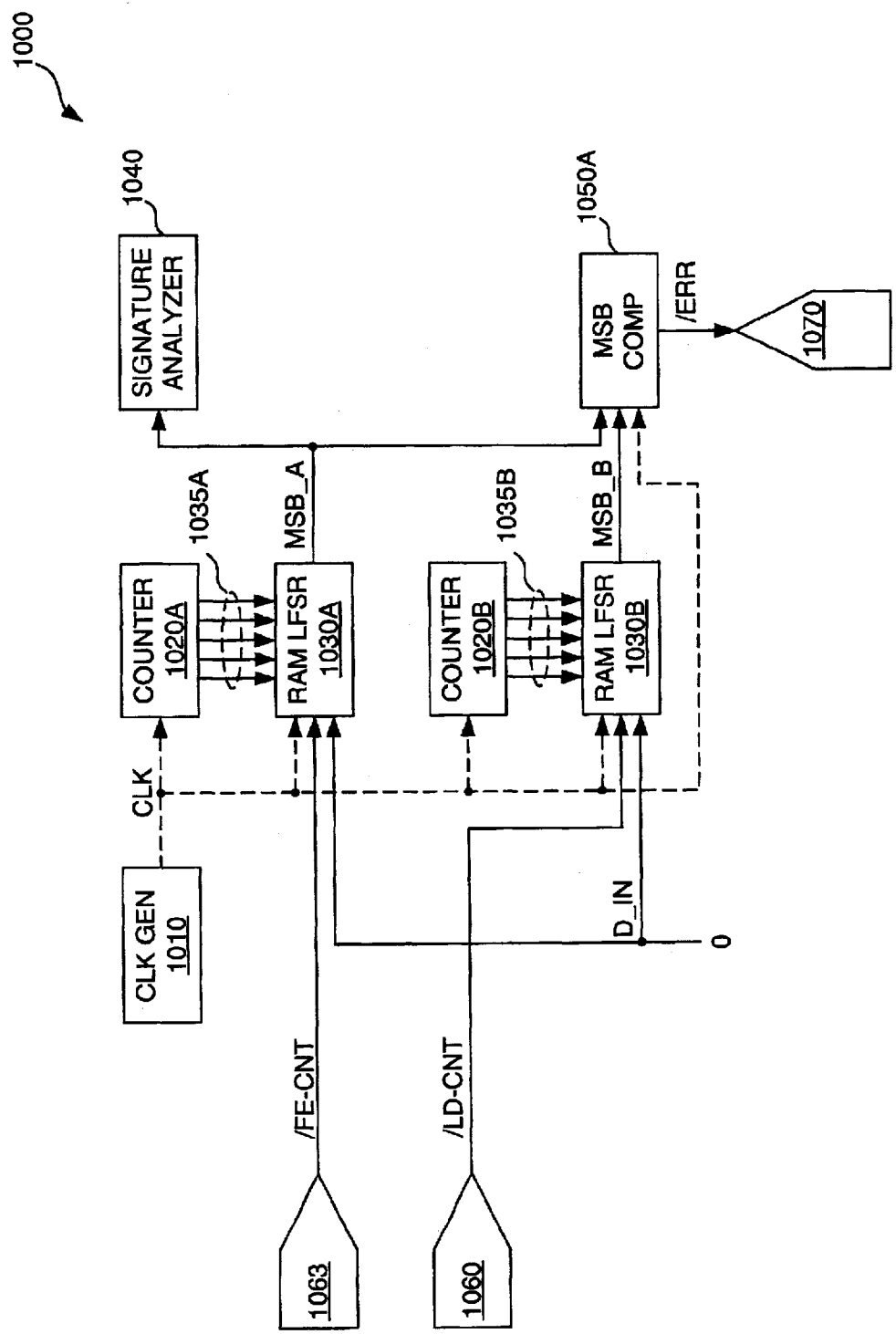
FIG. 10 depicts a test circuit 1000 in accordance with yet another embodiment of the invention.

FIG. 10 depicts a test circuit 1000 specifically adapted for testing FPGAs in the Virtex™ family available from Xilinx, Inc., of San Jose, Calif. Test circuit 1000 includes a clock generator 1010 connected to a pair of counters 1020A and 1020B and a respective pair of RAM LFSRs 1030A and 1030B. Counters 1020A and 1020B are connected to respective RAM LFSRs 1030A and 1030B via buses 1035A and 1035B. Test circuit 1000 additionally includes a signature analyzer 1040 and a most-significant-bit (MSB) comparator 1050A. These circuit components are externally accessible via a number of input and output pins depicted as flag-shaped circuit nodes.

A clock line CLK from clock generator 1010 connects to each of counters 1020A and 1020B, LFSRs 1030A and 1030B, and MSB comparator 1050A. A load/count pin 1060 can be externally set to logic zero (e.g., zero volts) to transfer data on a data line D_IN into each of LFSRs 1030A and 1030B. As discussed below, the force-error/count signal /FE-CNT on pin 1063 allows an external tester to verify that the test circuit 1000 correctly flags errors.

In the depicted embodiment, line D_IN is tied to a logic zero (e.g., zero volts); in other embodiments, line D_IN is externally accessible, allowing an external tester to load desired data patterns into LFSRs 1030A and 1030B. Once each of LFSRs 1030A and 1030B are loaded, load/count pin 1060 and force-error pin 1063 are set to logic ones, thereby allowing LFSRs 1030A and 1030B to count through a pseudo-random sequence.

The most-significant bit of LFSR 1030A connects to each of signature analyzer 1040 and MSB comparator 1050A via a line MSB_A; the most-significant bit of LFSR 1030B connects to MSB comparator 1050A via a line MSB_B. Both LFSRs are configured the same, and should therefore generate the same pseudo-random sequence of most-significant bits. MSB comparator 1050A compares the most-significant bit of each LFSR after each clock to ensure that both LFSRs step through the same sequence. MSB comparator 1050A flags any mismatch between MSB_A and MSB_B by providing a logic zero on an external pin 1070. Such an error indicates that the FPGA resources used to instantiate test circuit 1000 do not function properly at the selected clock frequency.

Signature analyzer 1040 is, in one embodiment, a seventeen-bit LFSR counter with a clock terminal connected to line MSB_A. Because LFSR 1030A runs through a deterministic sequence, line MSB_A should transition between one and zero a certain number of times for a given number of transitions on clock line CLK. Signature analyzer 1040 therefore indicates an error if the count stored in signature analyzer 1040 does not indicate the correct number of signal transitions. (The discussion of FIG. 16 below details one embodiment of signature analyzer 1040.)

Force-error pin 1063 enables an external tester to determine whether test circuit 1000 will flag an error if the output of RAM LFSR 1030A differs from that of RAM LFSR 1030B. Such a test is performed by leaving input pin 1063 low when pin 1060 is brought high. LFSR 1030B will therefore increment, while LFSR 1030A merely repetitively loads zeros. The respective most-significant bits MSB_A and MSB_B will eventually fail to match, a condition that should result in an error flag (i.e., a logic zero on pin 1070). Further, LFSR 1030A's failure to count should cause signature analyzer 1040 to contain the wrong count. Pin 1063 can thus be employed to ensure that test circuit 1000 is capable of noting errors.

Figure 11:
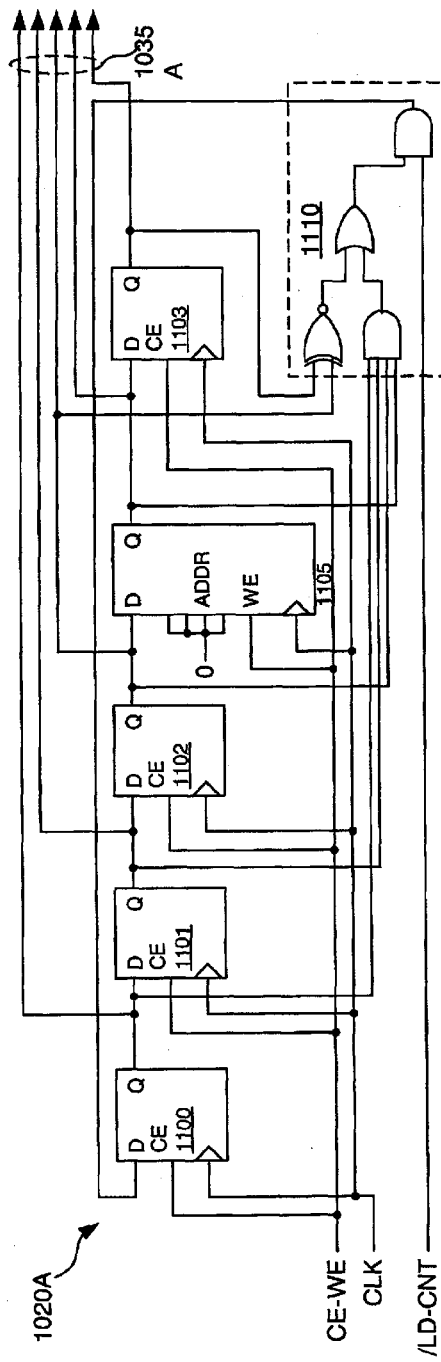
FIG. 11 schematically depicts counter 1020A of FIG. 10 (counter 1020B is identical).

FIG. 11 schematically depicts counter 1020A of FIG. 10 (counter 1020B is identical). Counter 1020A can be any type of synchronous counter, but is configured as an LFSR in the depicted embodiment because LFSRs are very fast and require fewer resources than other counters of comparable size. Counter 1020A includes four D flip-flops 1100–1103 and a 16×1 RAM 1105. Each address line of RAM 1105 is tied to a logic zero. Thus configured, RAM 1105 acts as a one-bit storage element similar to flip-flops 1100–1103. This configuration is used to ensure that counter 1020A packs efficiently into Virtex™ FPGAs.

Counter 1020A includes a feedback circuit 1110 with the requisite logic to preset counter 1020A and to provide feedback signals to flip-flop 1100 so that counter 1020A operates as an LFSR. Line /LD-CNT can be the same or different from the like-named line of FIG. 10. Clocking counter 1020A while line /LD-CNT is a logic zero loads counter 1020A with zeros; clocking counter 1020A while line /LD-CNT is a logic one causes counter 1020A to count through each of the 32 possible combinations of five binary digits. Bus 1035A conveys these states to LFSR 1030A.

For a detailed description of LFSRs and how to implement them using FPGAs, see the Xilinx application note entitled "Efficient Shift Registers, LFSR Counters, and Long Pseudo-Random Sequence Generators," by Peter Alfke, XAPP 052 Jul. 7, 1996 (Version 1.1), which is incorporated herein by reference.

Figure 12:
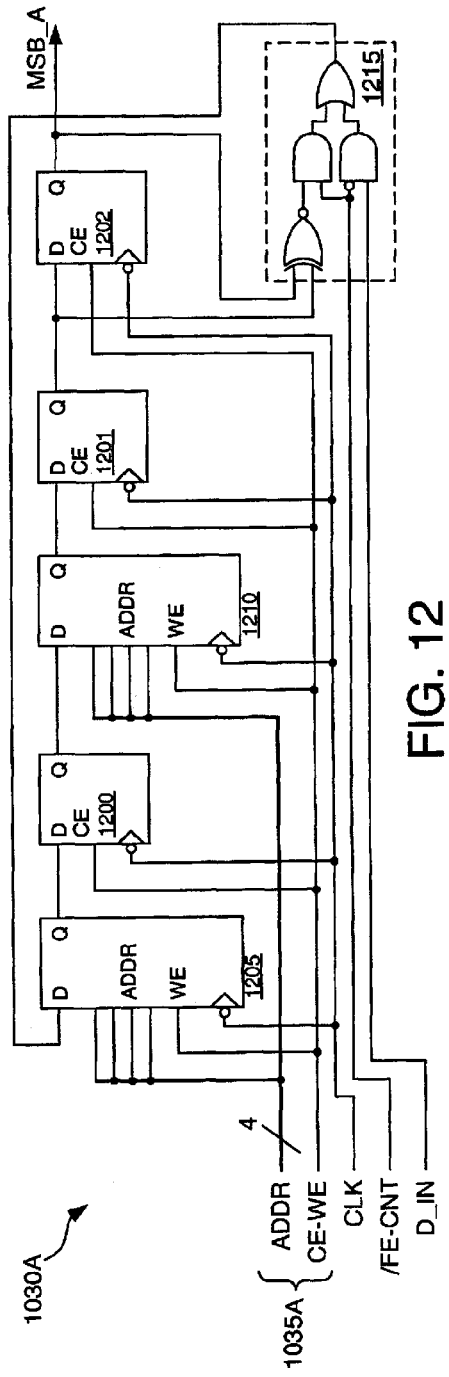
FIG. 12 schematically depicts an embodiment of LFSR 1030A of FIG. 10 (LFSR 1030B is identical to LFSR 1030A, except that line /FE-CNT connects instead to line /LD-CNT).

FIG. 12 schematically depicts an embodiment of LFSR 1030A of FIG. 10 (LFSR 1030B is identical to LFSR 1030A, except that line /FE-CNT connects instead to line /LD-CNT). LFSR 1030A includes three D flip-flops 1200–1202 and two 16×1 RAM arrays 1205 and 1210. Each address line of RAM arrays 1205 and 1210 is tied to a respective line from counter 1020A on bus 1035A (it does not matter which address line connects to which line of bus 1035A). The remaining line from bus 1035A connects to respective write-enable and clock-enable terminals of the various flip-flops and RAM arrays via a line CE-WE. The sense of each clock terminal of flip-flops 1200–1202 and RAM arrays 1205 and 1210 is inverted to allow the signals from bus 1035A time to settle before LFSR 1030A is clocked.

RAM arrays 1205 and 1210 each act as sixteen one-bit storage elements. Flip-flops 1200–1202 are also one-bit storage elements. LFSR 1030A is therefore a 105-bit LFSR. 35-bit LFSRs can have billions of states, so LFSR 1030 will not repeat for a very long time, even at relatively high clock frequencies. Consequently, each bit of LFSR 1030A provides a non-repeating, pseudo-random sequence of ones and zeroes during a test period. The most-significant bit of LFSR 1030A (or any other bit) is conveyed to MSB comparator 1050 (FIGS. 6 and 10) on line MSB_A for comparison with the same bit from LFSR 1030B. LFSR 1030A includes a feedback circuit 1215 with the requisite logic to preset LFSR 1030A with data from terminal D_IN (e.g., all zeros) and to provide feedback signals to RAM array 1205 so that the RAM arrays and flip-flops operate as an LFSR.

Figure 13:
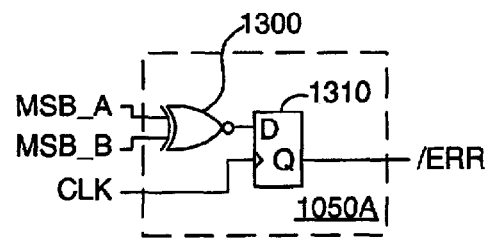
FIG. 13 schematically depicts an embodiment of MSB comparator 1050A of FIG. 10.

FIG. 13 schematically depicts an embodiment of MSB comparator 1050A of FIG. 10. Comparator 1050A includes an XNOR gate 1300 and a D flip-flop 1310. The Q output of flip-flop 1310 is preset to logic one. Comparator 1050A compares the logic levels on lines MSB_A and MSB_B. Any mismatch between MSB_A and MSB_M produces a logic zero that is stored in flip-flop 1310 and presented on error line /ERR. As with other gates depicted in the Figures, XNOR gate 1300 may be implemented using FPGA logic resources, as will be understood by those of skill in the art.

Figure 14:
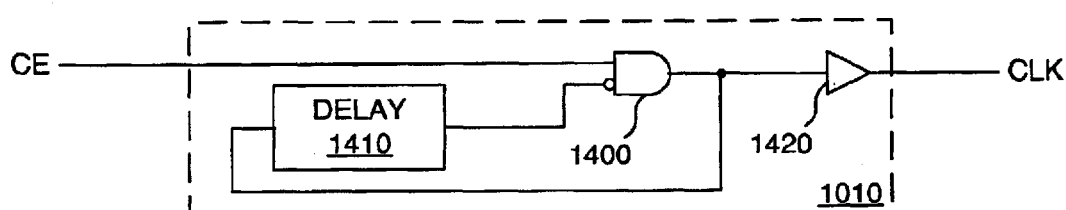
FIG. 14 depicts an example of clock generator 1010 of FIG. 10.

FIG. 14 depicts an example of clock generator 1010 of FIG. 10. Clock generator 1010 includes an AND gate 1400, a non-inverting delay element 1410, and a buffer 1420. AND gate 1400 acts as a simple inverter when the clock enable signal CE is a logic one, so that delay element 1410 and AND gate 1400 form a ring oscillator. Delay element 1410 can include any resource that produces a desired delay, a chain of look-up tables (LUTs) and interconnect resources, for example. Clock generator 1010 can be implemented entirely on-chip, and is therefore useful for field diagnostics. In one embodiment implemented on a Virtex™ FPGA, delay element 1410 is a chain of twelve buffers.

Figure 15:
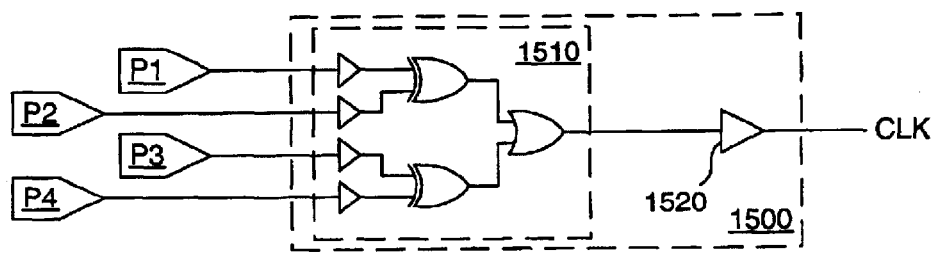
FIG. 15 depicts another type of clock generator 1500 for use in the present invention.

FIG. 15 depicts another type of clock generator 1500 for use in the present invention. Clock generator 1500 includes a clock-pulse generator 1510 and a buffer 1520. Clock-pulse generator 1510 uses four external clocks on pins P1–P4, each with a different amount of delay with respect to one another, to produce an output clock of higher frequency than the external clocks. Thus, for example, four clocks from a 50 MHz tester can be combined to create a single 200 MHz clock on line CLK. A conventional tester typically provides the external clock signals. Some PLDS, such as those of the Virtex™ II family of FPGAs available from Xilinx, Inc., include clock management resources that can be used to develop appropriate test clock signals.

Figure 16:
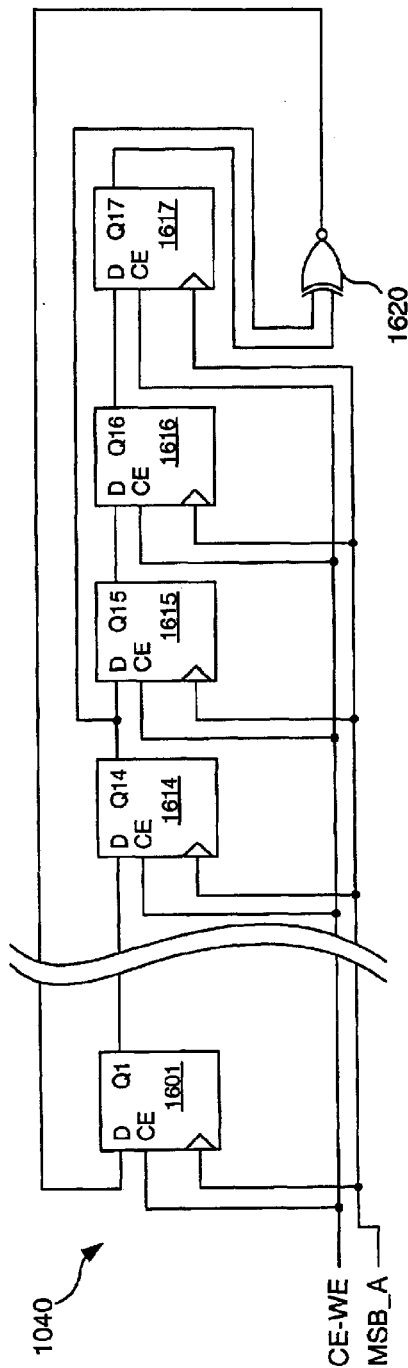
FIG. 16 depicts an embodiment of signature analyzer 1040 of FIG. 10.

FIG. 16 depicts an embodiment of signature analyzer 1040 of FIG. 10. Signature analyzer 1040 can be any suitable signature analyzer, a circuit for performing a conventional cyclic redundancy check (CRC), for example, but is an LFSR in the embodiment of FIG. 16. Signature analyzer 1040 includes seventeen D flip-flops 1601–1617 (flip-flops 1602–1613 are omitted from FIG. 16 for simplicity). An XOR gate 1620 provides the requisite feedback to configure signature analyzer 1040 as an LFSR. Before running a test, signature analyzer 1040 is reset using a set/reset line SR (FIG. 14) connected to each flip-flop. Then, during a subsequent test, signature analyzer 1040 clocks once for each zero-to-one signal transition on line MSB_A from LFSR 1030A. Because LFSR 1030A runs through a deterministic sequence, line MSB_A should transition between one and zero a certain number of times for a selected number of transitions on clock line CLK. Signature analyzer 1040 therefore indicates an error if the count stored in signature analyzer 1040 does not correspond to the correct number of signal transitions. The correct number of transitions can be determined by simulating test circuit 1000 (FIG. 10) for the selected number of clock periods.

Using a seventeen-bit LFSR assures that the pattern generated by signature analyzer 1040 will not soon repeat. Also, as noted above, LFSRs are useful counters because they are relatively fast and require relatively low overhead. In one embodiment, flip-flops 1601–1617 are output flip-flops in the IOBs of an FPGA under test. If necessary, the flip-flops can be placed in unbonded sites so that switching signals do not affect external pins.

Figure 17:
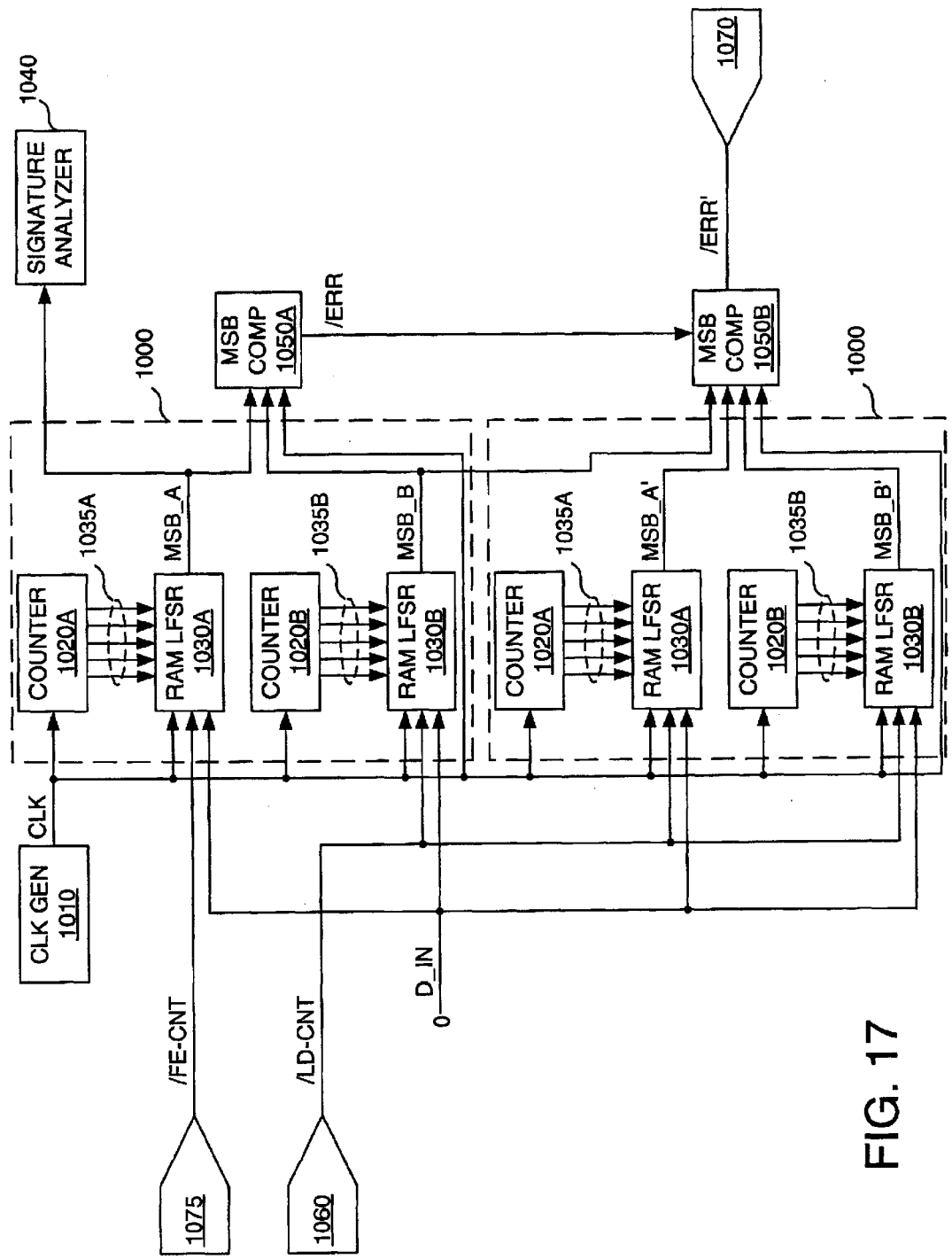
FIG. 17 shows how test circuit 1000 of FIG. 10 can be scaled to test additional resources on a given FPGA.

FIG. 17 shows how test circuit 1000 of FIG. 10 can be scaled to test additional resources on a given FPGA. This scaling is accomplished by duplicating a portion of test circuit 1000—labeled 1700 in FIG. 17—as many times as necessary. Portion 1700 includes counters 1020A and 1020B and LFSRs 1030A and 1030B. One instance of portion 1000 connects MSB comparator 1050A; the remaining one or more portions 1000 use a slightly different MSB comparator 1050B, which is described below in connection with FIG. 11.

Each instance of portion 1700 is arranged in series, such that the MSB comparator associated with each downstream instance compares each line MSB_A and MSB_B of that instance with MSB_B of the preceding instance. In the depicted example, MSB comparator 1050B compares the signals on lines MSB_A and MSB_B of the second instance—labeled MSB_A' and MSB_B', respectively—with each other and with MSB_B of the first instance. Any mismatch between or within instances results in an error flag (a logic zero) on error pin 1070. Incidentally, there need be only one signature analyzer 1040, because comparator circuits 1050A and 1050B ensure that the outputs of each RAM LFSR match.

Figure 18:
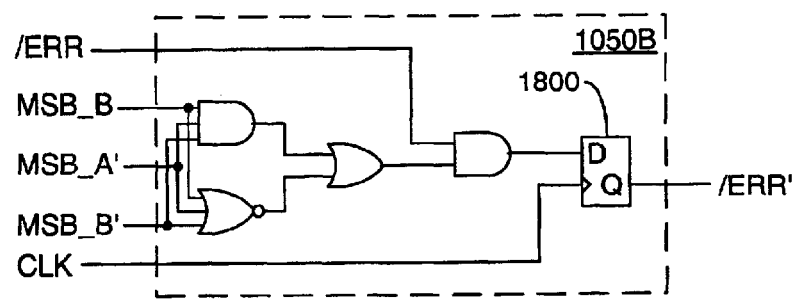
FIG. 18 details MSB comparator 1050B first introduced in FIG. 10.

FIG. 18 details MSB comparator 1050B first introduced in FIG. 10. MSB comparator 1050B includes a collection of gates and a flip-flop 1800 preset to logic one. MSB comparator 1050B compares each line MSB_A' and MSB_B' of that instance with MSB_B of the preceding instance. Any mismatch between or within instances results in an error flag (logic zero) on the error line /ERR' extending from the MSB comparator. Each MSB comparator 1050B also receives the error signal from a previous MSB comparator on line /ERR. Thus, errors reported by upstream comparators propagate through the test circuit, eventually to be reported on an external pin.

Figure 19:
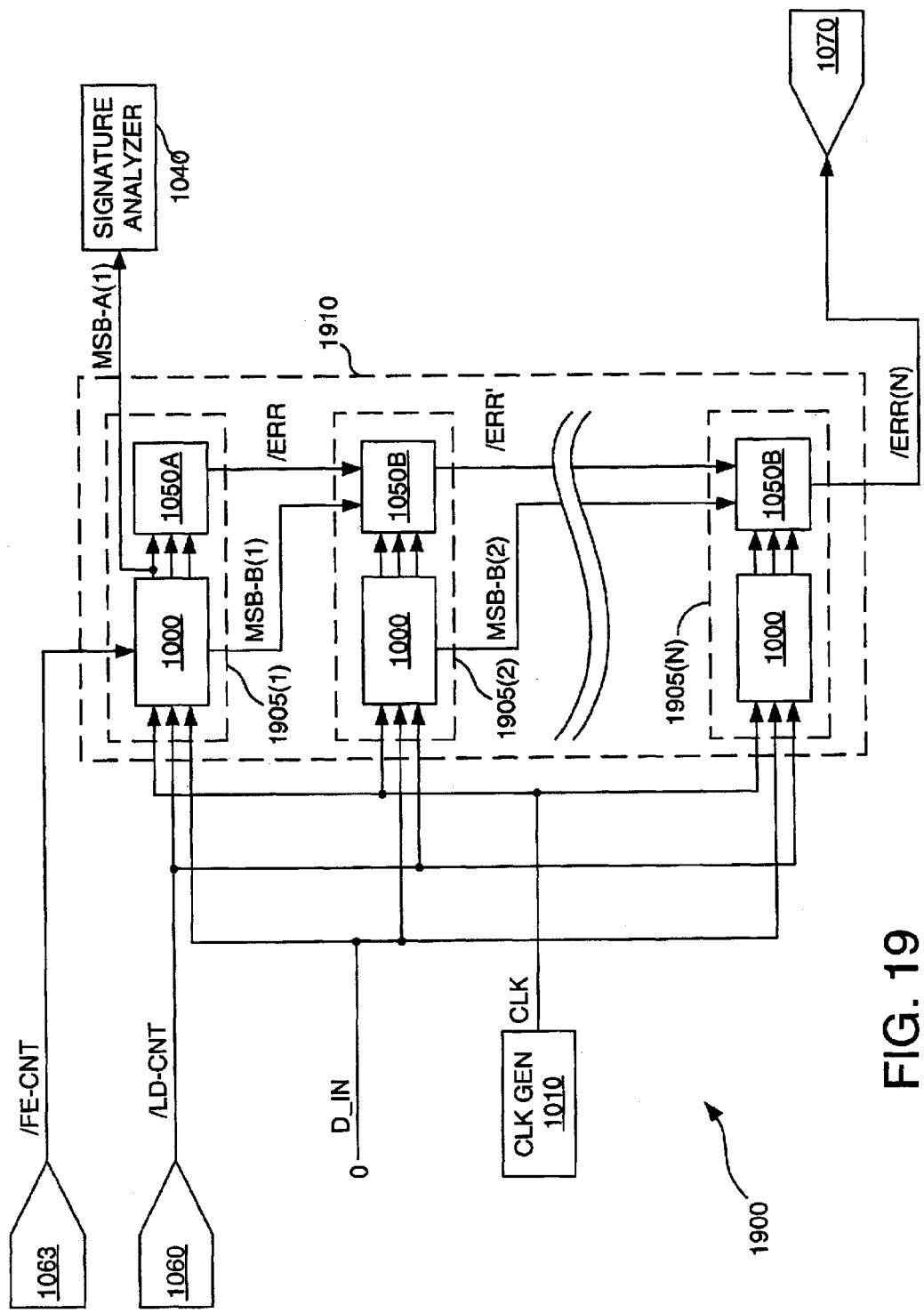
FIG. 19 schematically depicts a test circuit 1900 that includes N minor test circuits 1905(1)–1905(N), each comprised of a circuit portion 1000 and an associated MSB comparator (see FIG. 10).

FIG. 19 schematically depicts a test circuit 1900 that includes N minor test circuits 1905(1)–1905(N), each comprised of a circuit portion 1000 and an associated MSB comparator (see FIG. 10). When test circuit 1900 is instantiated in Virtex™ FPGAS, each minor test circuit 1905(1–N) occupies four CLBs. Each member of the Virtex™ family includes an array of CLBs with an even number of rows R and an even number of columns C. In one embodiment, test circuit 1900 is extended to fill two columns of a Virtex™ FPGA using R/2 instances. Minor test circuits 1905(1)–1905 (N) are collectively termed a "column" instance 1910.

Figure 20:
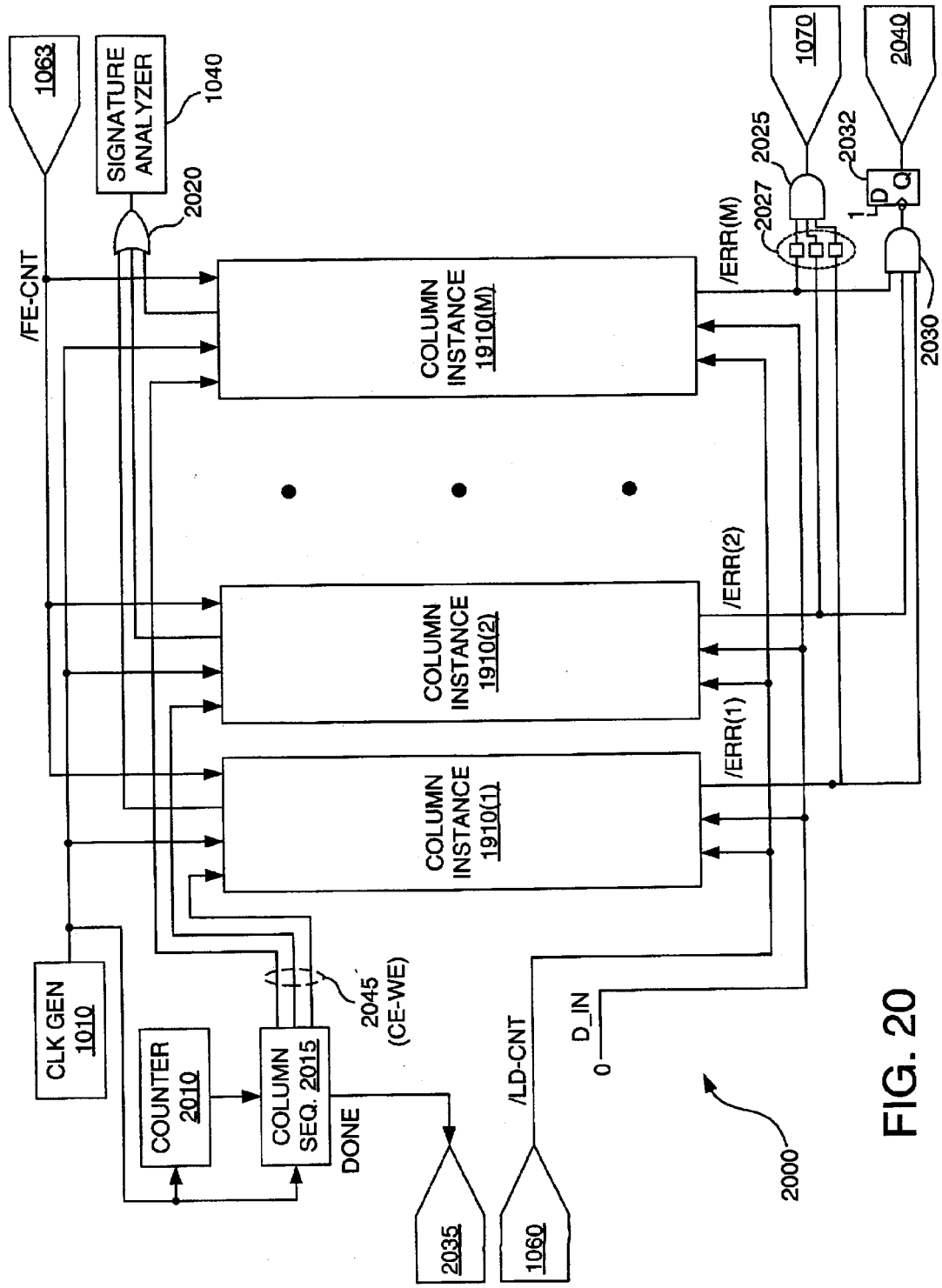
FIG. 20 schematically depicts a test circuit 2000 that employs M column instances 1910(1)–1910(M) to populate every row and column of a Virtex™ FPGA.

FIG. 20 schematically depicts a test circuit 2000 that employs M column instances 1910(1)–1910(M) to populate every row and column of a Virtex™ FPGA. As discussed above, each member of the Virtex™ family includes an even number C of columns, and each column instance 1910 occupies two columns. Thus, C/2 column instances can be used to populate an entire Virtex™ FPGA.

Test circuit 2000 includes a number of circuit elements in common with test circuits 1000 and 1900 of FIGS. 10 and 19, respectively, like-numbered elements being the same. Test circuit 2000 additionally includes circuitry that sequences through each column instance and indicates an error if any column instance generates an error signal on respective error lines /ERR(1)–/ERR(M).

The additional common circuitry includes a counter 2010, a column sequencer 2015, an M-input OR gate 2020, an M-input AND gate 2025 preceded by a collection of M ones catchers 2027, an M-input AND gate 2030 followed by a ones catcher 2032, and output pins 2035 and 2040. Each ones catcher in collection 2027 is identical to ones catcher 2032. Column sequencer 2015 can be a conventional one-hot register with a single memory location connected to each column instance 1910(1) through 1910(M) via respective ones of lines 2045. Counter 2010 counts up to some number of clock cycles sufficient to test one column instance before clocking column sequencer 2015. Sequencer 2015 cycles a single logic one from one register to the next, thus enabling each column instance in turn. Once each column instance has been tested, column sequencer 2015 stops counting and issues a logic one on line DONE to external pin 2035.

In one embodiment instantiated on a Virtex™ FPGA, each element of the common circuitry is implemented using IOB resources. This advantageously allows the CLBs to be populated using sets of identical circuits. In another embodiment, the common circuitry is implemented using resources external to the FPGA. Yet another embodiment dispenses with counter 2010 and column sequencer 2015, relying instead on external controls to provide the equivalent functionality. Ones catcher 2032 and identical ones catchers 2027 capture error signals and hold them on external pins 2040 and 1070.

Figure 21:
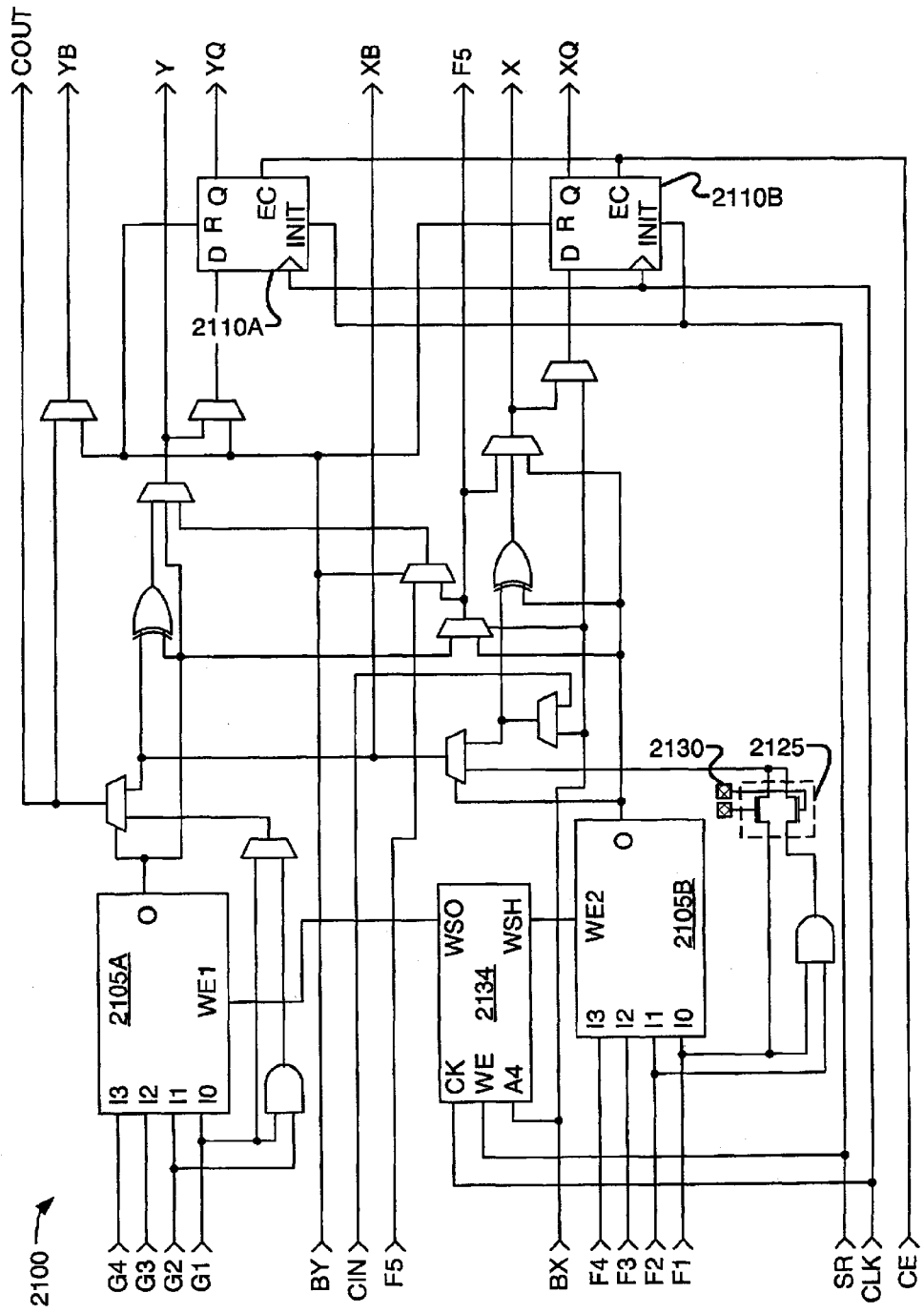
FIG. 21 is a schematic diagram of a "slice" 2100, one of two identical slices that make up an exemplary CLB in the Virtex™ family of devices available from Xilinx, Inc.
Figure 22A:
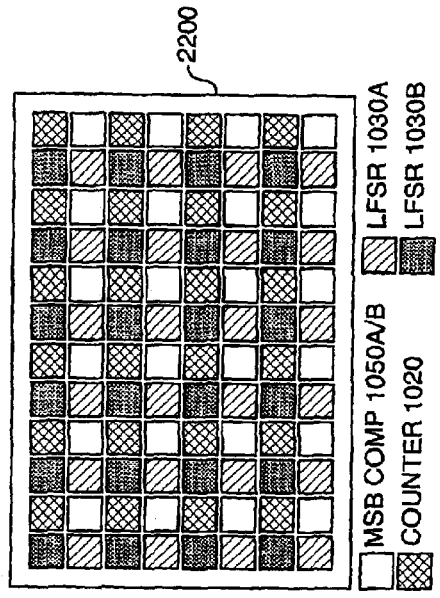
FIGS. 22A–22D depict four FPGA configurations for instantiating test circuit 2000 of FIG. 20 on an exemplary FPGA 2200.
Figure 22B:
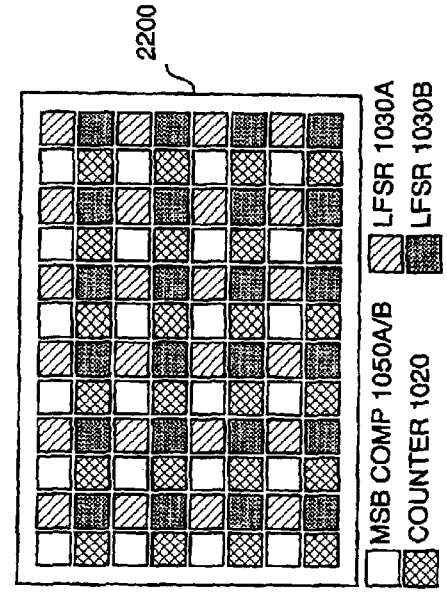
Figure 22C:
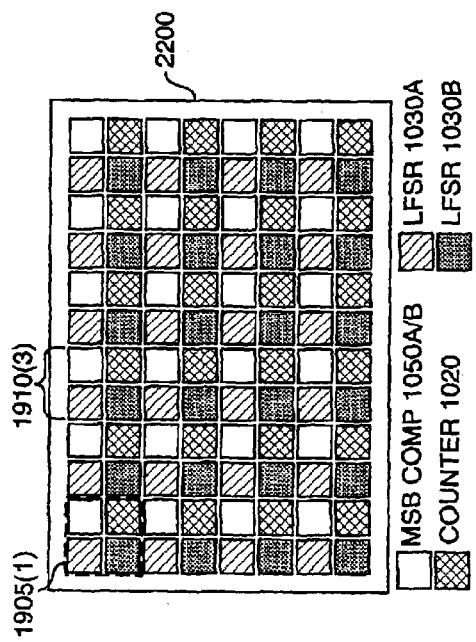
Figure 22D:
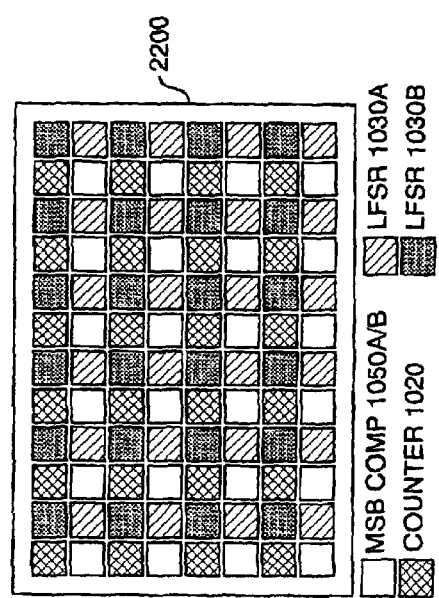

FIG. 21 is a schematic diagram of a "slice" 2100, one of two identical slices that make up an exemplary CLB in the Virtex™ family of devices available from Xilinx, Inc. All of the terminals to and from slice 2100 are connected to horizontal or vertical interconnect lines (not shown) through which they can be programmably connected to various other components within the FPGA.

Slice 2100 includes two 4-input LUTs 2105A and 2105B. LUTs 2105A and 2105B are each capable of implementing any arbitrarily defined Boolean function of up to four inputs. In addition, each of LUTs 2105A and 2105B can provide a 16×1-bit synchronous RAM. Furthermore, the two LUTs can be combined to create a 16×2-bit or 32×1-bit synchronous RAM, or a 16×1-bit dual-port synchronous RAM.

Slice 2100 also includes a pair of sequential storage elements 2110A and 2110B that can be configured either as edge-triggered D-type flip-flops or as level-sensitive latches. The D inputs can be driven either by LUTs 2105A and 2105B or directly from input terminals, bypassing LUTs 2105A and 2105B. Each storage element includes an initialization terminal INIT, a reverse-initialization terminal R, an enable-clock terminal EC, and a clock terminal conventionally designated using the symbol ">". The INIT terminal forces the associated storage element into an initialization state specified during configuration; the reverse-initialization terminal R forces the storage element in the opposite state as the INIT terminal. Terminals INIT and R can be configured to be synchronous or asynchronous, and the sense of each control input can be independently inverted.

Configuration memory cells define the functions of the various configurable elements of slice 2100. An exemplary two-input multiplexer 2125 includes a pair of MOS transistors having gate terminals connected to respective configuration memory cells 2130. Other configuration memory cells used to define the functions of the remaining programmable elements of slice 2100 are omitted for brevity. The use of configuration memory cells to define the function of programmable logic devices is well understood in the art.

A detailed discussion of slice 2100 is not necessary for understanding the present invention, and is therefore omitted for brevity. For a more detailed treatment of the operation of many components within slice 2100, see the co-pending U.S. patent application Ser. No. 08/786,818 entitled "Configurable Logic Block with AND Gate for Efficient Multiplication in FPGAS," by Chapman et al., U.S. Pat. No. 5,889,413 entitled "Lookup Tables Which Double as Shift Registers," by Bauer, and U.S. Pat. No. 5,914,616, entitled "FPGA Repeatable Interconnect Structure with Hierarchical Interconnect Lines," by Steven P. Young, et al. Each of the foregoing documents is incorporated herein by reference.

FIGS. 22A–22D depict four FPGA configurations for instantiating test circuit 2000 of FIG. 20 on an exemplary FPGA 2200. For simplicity, FPGA 2200 includes an eight by twelve array of CLBs 2110, each CLB including two slices 2100. Virtex™ FPGAs are larger than FPGA 2200, however, the smallest Virtex™ FPGA having a sixteen by twenty-four array of CLBs.

When test circuit 2000 is instantiated on a Virtex™ FPGA, each minor test circuit 1905(1–N)—detailed in FIG. 19—occupies four CLBs, leaving only a single unused LUT for every four CLBs. Columns of test circuits 1905(1–N) are connected together to form column instance 1910(1–M), also detailed in FIG. 19. An exemplary test circuit 1905(1) and an exemplary column instance 1910(3) are labeled in FIG. 22A. The unused LUTs from the test circuits can then be configured to implement other circuits, if desired, such as clock generator 1010, clock-pulse generator 2210, XOR gate 920, OR gate 2020, AND gate 2025, and AND gate 2030.

Figure 23:
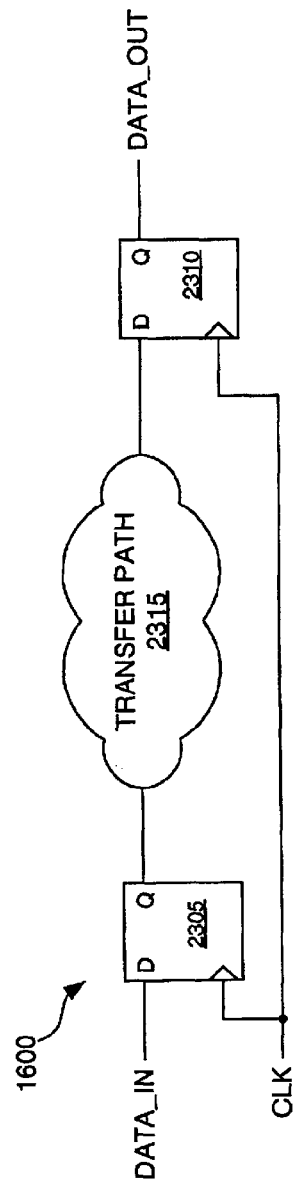
FIG. 23 (prior art) depicts a pair of sequential storage elements 2305 and 2310 interconnected via an exemplary register transfer path 2315.

The four configurations of FIGS. 22A–22D together provide 100% test coverage of all CLB flip-flops and LUT RAM. However, populating an FPGA with these test circuits will not test the myriad potential routing paths between registers, conventionally referred to as "register transfer paths." FIG. 23 (prior art) depicts a pair of sequential storage elements 2305 and 2310 interconnected via an exemplary register transfer path 2315. Transfer path 2615 includes routing resources and possibly combinatorial and/or sequential logic. Fortunately, verifying the correct operation of the various memory elements also verifies the operation of the register transfer paths used to interconnect those elements. The present invention can therefore be extended to test routing resources.

Testing routing resources in accordance with the invention is an iterative process. The test circuits described above can be run a number of times, in each case employing a different set of interconnect resources. Those of skill in the art are familiar with the process of rerouting designs to use different routing resources in an effort to test those resources.

Virtex™ FPGAs are fully compliant with the IEEE Standard 1149.1 Test Access Port and Boundary-Scan Architecture, commonly referred to as the "JTAG standard," or simply "JTAG." Using JTAG, FPGA resources can be field tested by importing a serial stimulus vector to program the FPGA to include the above-described test circuitry. Then, as described above, the test circuitry can be run at speed to determine whether the resources occupied by the test circuitry function properly at speed.

While the present invention has been described in connection with specific embodiments, variations of these embodiments will be obvious to those of ordinary skill in the art. For example, the foregoing test describes just a few ways to test programmable resources and circuits instantiated in programmable resources; many other test methods might also be used. Those of skill in testing PLDS can adapt many standard tests for use with the invention. Therefore, the spirit and scope of the appended claims should not be limited to the foregoing description.

What is claimed is:

1. A method comprising:
   a. testing a PLD of a type;
   b. selling the PLD to a customer for instantiation of a customer-specified design;
   c. receiving an expression of the customer-specific design;
   d. selecting a defective PLD of the type;
   e. testing the defective PLD to determine whether the defective PLD functions with the customer-specific design; and
   f. if the testing the defective PLD fails, then performing another test on the defective PLD using a different customer-specific design, wherein the customer-specific design requires a collection of nets defined on the defective PLD by the expression of the customer-specified design, and wherein testing the defective PLD includes validating the collection of nets.

2. The method of claim 1, wherein the nets are validated without instantiating the customer-specific design on the PLD.

3. The method of claim 1, wherein the PLD includes a collection of logic blocks, wherein the customer-specific design requires a subset of the collection of logic blocks, and wherein the testing the defective PLD includes testing the subset of the collection of logic blocks.

4. The method of claim 3, wherein the collection of logic blocks is tested without instantiating the customer-specific design on the PLD.

5. The method of claim 1, further comprising selling the defective PLD to the customer.

6. The method of claim 1, wherein the type comprises an external pin configuration.

7. The method of claim 1, wherein the defective PLD includes programmable logic blocks and programmable interconnect, and wherein logic elements of the design are instantiated using a subset of the logic blocks and routing portions of the design are instantiated as a collection of nets defined in the interconnect.

8. The method of claim 7, wherein testing the defective PLD comprises configuring a plurality of the subset of logic blocks used to instantiate the design to provide test-signal generators.

9. The method of claim 7, wherein testing the defective PLD comprises configuring a plurality of the subset of logic blocks used to instantiate the design to provide test-signal observers.

10. The method of claim 7, wherein the logic blocks comprise input/output blocks.

11. The method of claim 7, wherein testing the defective PLD comprises testing the nets without instantiating the logic elements of the design in the subset of logic blocks.

12. The method of claim 1, wherein testing the defective PLD includes instantiating one or more test circuits on the PLD, the test circuits employing PLD resources required by the customer-specific design and some test-circuit overhead, wherein the test-circuit overhead comprises programmable resources not required by the customer-specific design.

13. A method of testing a programmable logic device to determine whether the programmable logic device is functional when instantiated with a given design, wherein the programmable logic device includes a plurality of programmable logic blocks and programmable interconnect, the method comprising:
   a. identifying a subset of the configurable logic blocks employed to instantiate logic elements of the design;
   b. identifying a collection of nets employed by the design and instantiated in the configurable interconnect;
   c. interconnecting the subset of the configurable logic blocks using the collection of nets; and
   d. configuring a plurality of the subset of configurable logic blocks as test-signal generators,
   wherein interconnecting the subset of the configurable logic blocks using the collection of nets comprises:
   e. interconnecting first ones of the subset of the configurable logic blocks using a first subset of the collection of nets;
   f. interconnecting second ones of the subset of the configurable logic blocks using a second subset of the collection of nets;
   g. testing the first subset of the collection of nets before interconnecting the second ones of the subset of the configurable logic blocks using the second subset of the collection of nets.

14. The method of claim 13, further comprising reconfiguring the subset of the configurable logic blocks to instantiate the logic elements of the design.

15. The method of claim 13, further comprising testing the second subset of the collection of nets after testing the first subset of the collection of nets.

16. The method of claim 13, further comprising configuring a second plurality of the subset of configurable logic blocks as test-signal observers.

17. The method of claim 13, further comprising holding a portion of the programmable interconnect to a logic level while providing signal transitions on the collection of nets.

18. A method of verifying the functionality of a design specified for instantiation on a programmable logic device, the programmable logic device including programmable blocks selectively inter-connectable by a collection of programmable interconnect resources, the method comprising:
   a. identifying a plurality of the programmable blocks required for the design;
   b. identifying a plurality of the interconnect resources required for the design to interconnect the plurality of programmable blocks;
   c. configuring at least a selected one of the plurality of programmable blocks to provide a signal-generation function;
   d. configuring a second selected one of the plurality of programmable blocks to provide a test-signal-observer; and
   e. connecting the first-mentioned selected one of the plurality of programmable blocks to the second selected one of the plurality of programmable blocks via a portion of the interconnect resources;
   wherein the design specifies a second function different from the signal-generation function for the selected one of the plurality of programmable blocks.

19. The method of claim 18, further comprising sending a test signal from the first selected programmable block to the second selected programmable block to test the portion of the interconnect resources.

20. The method of claim 19, further comprising reading the state of the second selected programmable block.

21. The method of claim 18, wherein the programmable blocks include at least one of logic blocks, input/output blocks, and memory blocks.

22. A computer-readable medium having computer-executable instructions for performing the steps of:
   a. receiving an expression for a customer design for instantiation on a programmable logic device;
   b. identifying a plurality of programmable logic resources on the programmable logic device required for the design;
   c. generating an expression of a test design different from the customer design, wherein the test circuit uses substantially all of the programmable resources required for the customer design;
   d. identifying a plurality of programmable blocks employed by the design to perform logic functions on the programmable logic device;
   e. identifying a plurality of interconnect resources on the programmable logic device required for the design to interconnect the plurality of programmable blocks; and
   f. configuring at least a selected one of the plurality of programmable blocks to provide a signal-generation function different from the logic function specified by the customer design for the selected one of the plurality of programmable blocks.

23. The computer-readable medium of claim 22, further comprising a macro library having data structures defining a plurality of test-signal generators for instantiation on a programmable logic device.

24. The computer-readable medium of claim 22, further comprising a macro library having data structures defining a plurality of test-signal observers for instantiation on a programmable logic device.

25. The computer-readable medium of claim 22, wherein the test design includes a plurality of sub-designs.

\* \* \* \* \*